United States Patent [19]

Schell et al.

[11] Patent Number: 5,738,177
[45] Date of Patent: Apr. 14, 1998

[54] PRODUCTION ASSEMBLY TOOL

[75] Inventors: Craig A. Schell, Baltimore; James R. Parks, Timonium, both of Md.; Todd A. Hagan, Windsor, Pa.; Pradeep Kumar Nandam, Chelmsford, Mass.; Rouse R. Bailey, Jr., New Park, Pa.

[73] Assignee: Black & Decker Inc., Newark, Del.

[21] Appl. No.: 687,309

[22] Filed: Jul. 25, 1996

[51] Int. Cl.$^6$ ........................................ B25B 23/14
[52] U.S. Cl. .................. 173/178; 173/181; 192/56.57
[58] Field of Search .......................... 173/176, 178, 173/177, 181; 192/56.57, 56.62

[56] References Cited

U.S. PATENT DOCUMENTS

| | | |
|---|---|---|
| 2,031,133 | 2/1936 | Schumann . |
| 2,130,111 | 9/1938 | Whitney et al. . |
| 2,170,208 | 8/1939 | Murray . |
| 2,252,598 | 8/1941 | Jeffrey . |

(List continued on next page.)

FOREIGN PATENT DOCUMENTS

| | | |
|---|---|---|
| 063460 | 12/1986 | European Pat. Off. . |
| 182986 | 11/1988 | European Pat. Off. . |
| 277105 | 12/1990 | European Pat. Off. . |
| 239670 | 1/1991 | European Pat. Off. . |
| 525911 | 2/1993 | European Pat. Off. . |
| 320723 | 3/1993 | European Pat. Off. . |
| 465521 | 3/1994 | European Pat. Off. . |
| 585540 A1 | 3/1994 | European Pat. Off. . |
| 2230670.3 | 1/1974 | Germany . |
| 2544919.8 | 4/1977 | Germany . |
| 2726818.4 | 12/1977 | Germany . |
| 8002536 | 2/1980 | Germany . |
| 3023005.8 | 4/1982 | Germany . |
| 2829291 | 12/1982 | Germany . |
| 2832565 | 12/1983 | Germany . |
| 3324304 | 1/1985 | Germany . |
| 3324304 A1 | 1/1985 | Germany . |
| 8422411 | 1/1986 | Germany . |
| 3540652 | 5/1986 | Germany . |
| 3718247.1 | 12/1987 | Germany . |
| 3740076.2 | 6/1988 | Germany . |
| 3822986 | 1/1990 | Germany . |
| 3830197 C1 | 1/1990 | Germany . |
| 3842346 | 6/1990 | Germany . |
| 3842347 | 6/1990 | Germany . |
| 3938787 A1 | 5/1991 | Germany . |
| 9109407 | 10/1991 | Germany . |
| 9200980 | 5/1992 | Germany . |
| 4239559.3 | 5/1994 | Germany . |
| 4243501.3 | 6/1994 | Germany . |
| 2064682 | 6/1981 | United Kingdom . |
| WO 82/00183 | 1/1982 | WIPO . |

Primary Examiner—Scott A. Smith
Attorney, Agent, or Firm—Harness, Dickey & Pierce, P.L.C.

[57] ABSTRACT

A production assembly tool for securing fasteners to a workpiece such as an automobile body. The production assembly tool of the present invention includes a housing which encases a motor, a transmission, a clutch mechanism and a control module. The control module controls the running and braking of the motor and prevents both over and under securing of a fastener caused by falsely detected tool clutch conditions. An improved clutch sensor switch is operatively associated with the control module for detecting clutch disengagement. The clutch mechanism is designed to drive the fastener until the clutch sensor switch detects clutch disengagement and signals the control circuit to stop drive and start braking. The production assembly tool further includes a system for ensuring accurate placement of the power tool motor in the power tool housing subsequent to motor servicing or repair. Further, an adjustment collar located in the tool nose allows selective access to a clutch adjustment mechanism of the tool located within the housing for torque level adjustment. In addition, the tool housing is covered by an integral, self-sealing non-marring overmold exterior. The overmold exterior allows a lubrication needle to be inserted through an aperture located beneath the overmold exterior. After the needle is removed, the overmold exterior subsequently self-seals, thereby preventing dirt from entering the interior of the tool housing and the applied lubrication from leaking.

17 Claims, 9 Drawing Sheets

U.S. PATENT DOCUMENTS

| | | |
|---|---|---|
| 2,806,366 | 9/1957 | Woestemeyer . |
| 2,818,712 | 1/1958 | Barnes et al. . |
| 2,885,884 | 5/1959 | Nelson . |
| 2,945,374 | 7/1960 | Simmons . |
| 2,969,132 | 1/1961 | Stewart . |
| 3,018,866 | 1/1962 | Elliott et al. . |
| 3,095,955 | 7/1963 | Orwin . |
| 3,162,250 | 12/1964 | Sindelar . |
| 3,185,275 | 5/1965 | Orwin . |
| 3,205,992 | 9/1965 | Clapp . |
| 3,252,303 | 5/1966 | Weasler et al. . |
| 3,261,198 | 7/1966 | Able et al. . |
| 3,263,785 | 8/1966 | Krouse et al. . |
| 3,270,844 | 9/1966 | Orwin . |
| 3,288,258 | 11/1966 | Taylor . |
| 3,292,754 | 12/1966 | Peterson . |
| 3,319,753 | 5/1967 | Orwin et al. . |
| 3,456,486 | 7/1969 | Kross . |
| 3,608,686 | 9/1971 | Martin et al. . |
| 3,710,873 | 1/1973 | Allen . |
| 3,740,999 | 6/1973 | Whitehouse . |
| 3,741,313 | 6/1973 | States . |
| 3,766,990 | 10/1973 | Eckman et al. . |
| 3,834,467 | 9/1974 | Fuchs . |
| 3,937,036 | 2/1976 | Sauerwein . |
| 3,942,337 | 3/1976 | Leonard et al. . |
| 3,993,145 | 11/1976 | Findeli . |
| 4,199,964 | 4/1980 | Grey . |
| 4,231,270 | 11/1980 | Totsu . |
| 4,263,996 | 4/1981 | Putney . |
| 4,265,320 | 5/1981 | Tanaka et al. . |
| 4,294,340 | 10/1981 | Kunze . |
| 4,338,798 | 7/1982 | Gilman . |
| 4,368,784 | 1/1983 | Wünsch et al. . |
| 4,467,902 | 8/1984 | Girguis . |
| 4,470,312 | 9/1984 | Thompson . |
| 4,548,305 | 10/1985 | Anderson . |
| 4,641,551 | 2/1987 | Pascaloff . |
| 4,649,774 | 3/1987 | Karlsson et al. . |
| 4,712,456 | 12/1987 | Yuan . |
| 4,834,192 | 5/1989 | Hansson . |
| 4,842,078 | 6/1989 | Hansson . |
| 4,852,386 | 8/1989 | Grabovac et al. . |
| 4,869,131 | 9/1989 | Ohmori . |
| 4,869,139 | 9/1989 | Gotman . |
| 4,896,775 | 1/1990 | Girguis . |
| 4,898,249 | 2/1990 | Ohmori . |
| 4,991,473 | 2/1991 | Gotman . |
| 5,005,682 | 4/1991 | Young et al. . |
| 5,035,311 | 7/1991 | Girguis . |
| 5,071,397 | 12/1991 | Grimm . |
| 5,080,642 | 1/1992 | Takami . |
| 5,134,909 | 8/1992 | Sasaki . |
| 5,180,042 | 1/1993 | Ogiso . |
| 5,195,406 | 3/1993 | Lindqvist . |
| 5,307,912 | 5/1994 | Girguis . |
| 5,343,784 | 9/1994 | Neuhaus . |
| 5,380,132 | 1/1995 | Parks . |
| 5,440,215 | 8/1995 | Gilmore ................................. 173/178 |
| 5,569,118 | 10/1996 | Holmin ................................. 173/178 |

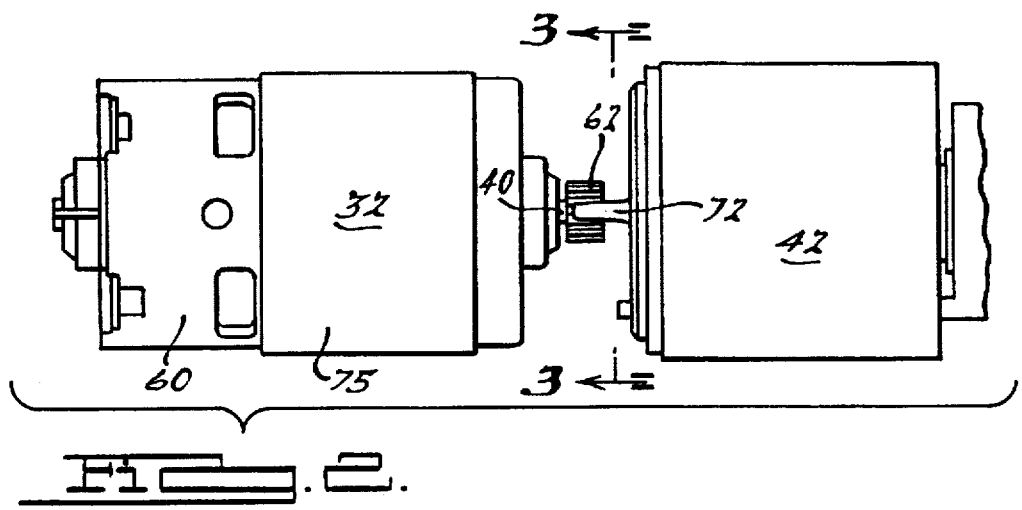
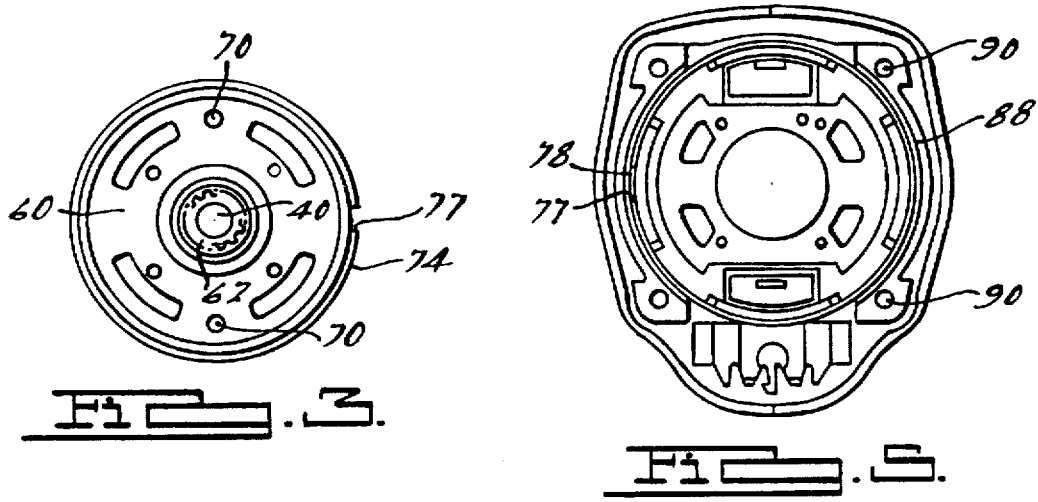
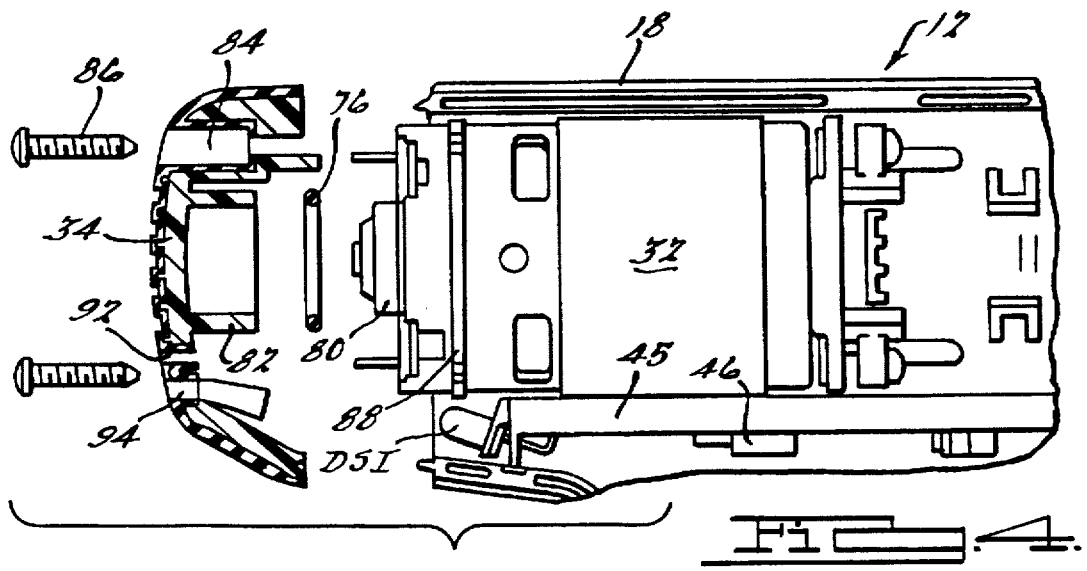

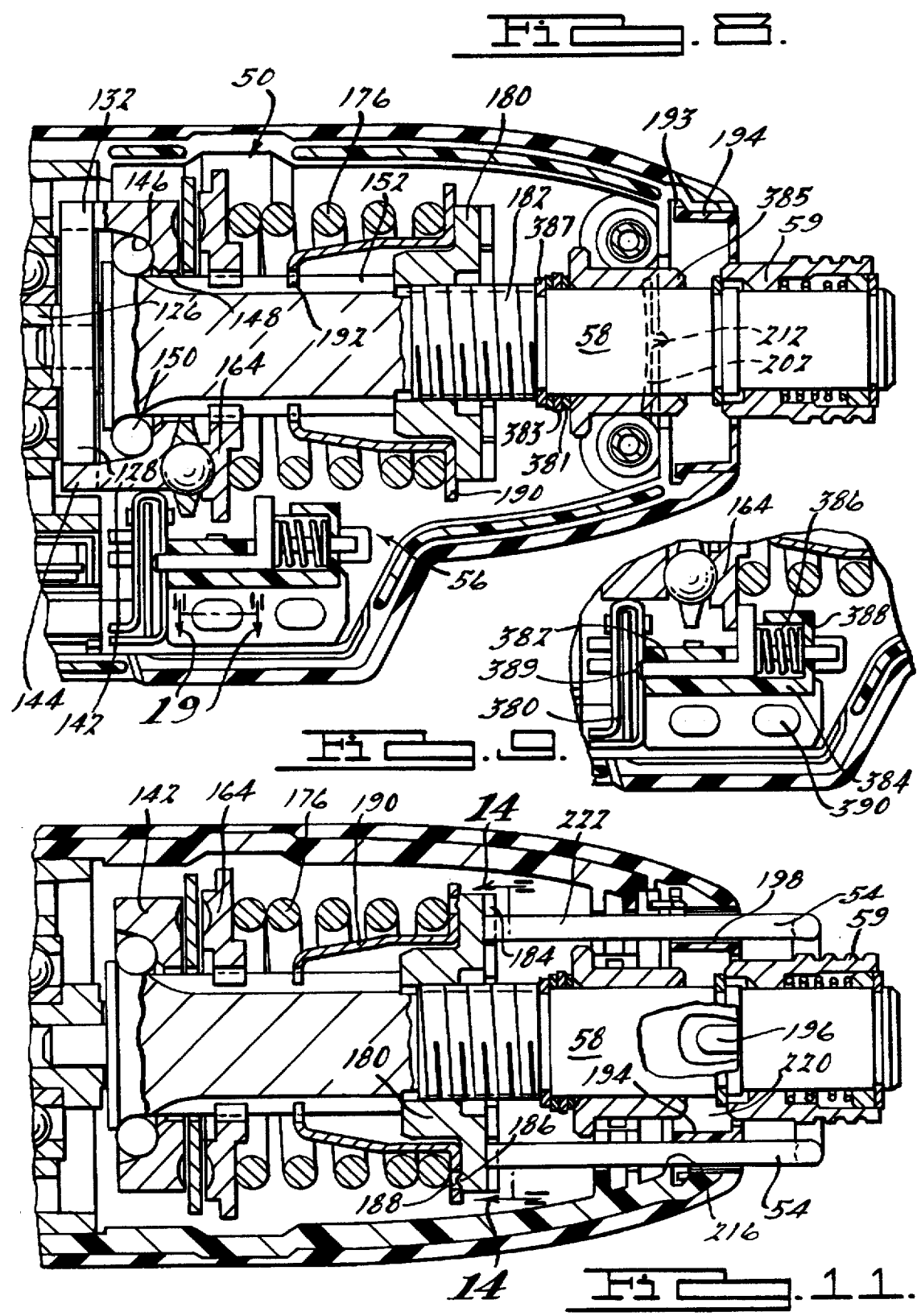

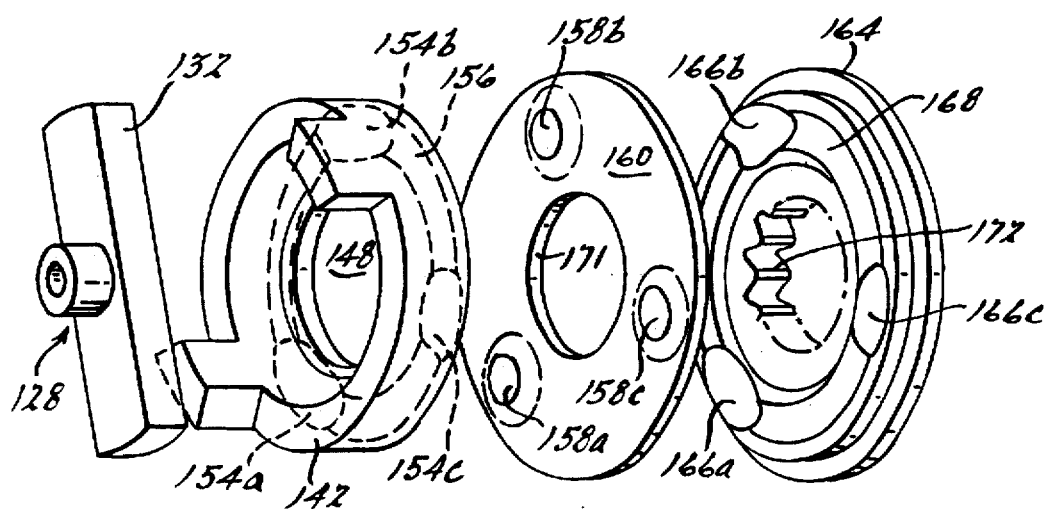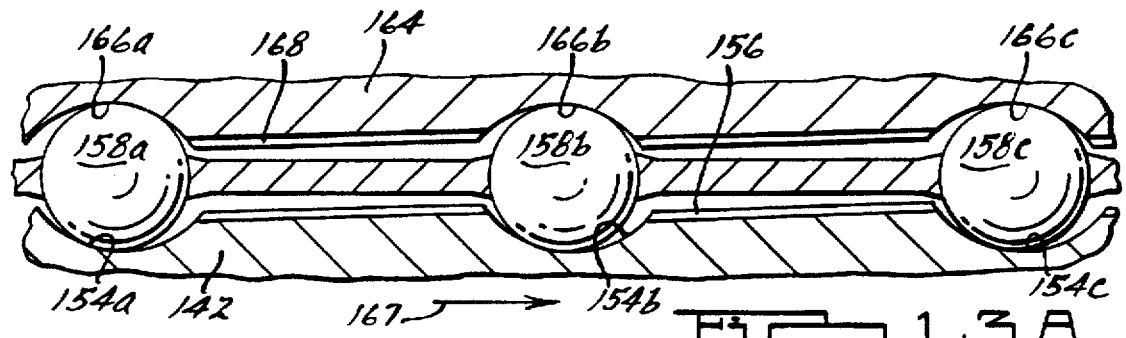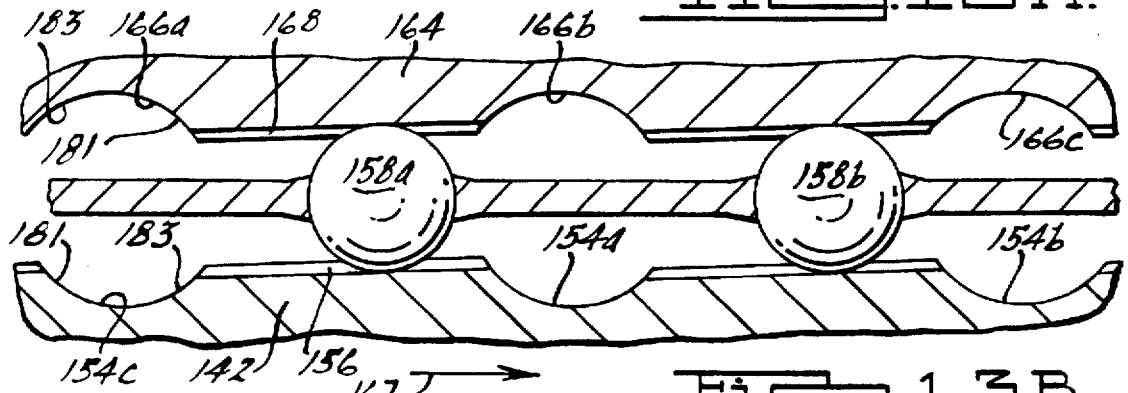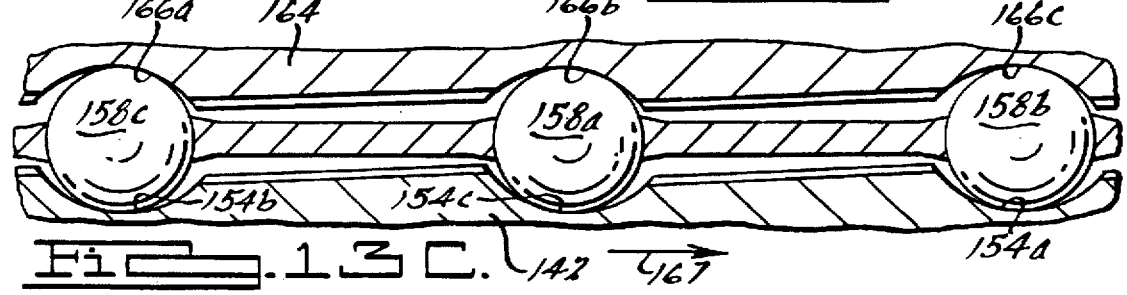

PRODUCTION ASSEMBLY TOOL

BACKGROUND & SUMMARY OF THE INVENTION

The present invention is generally directed to an improved production assembly tool. In particular, the present invention is directed to a production assembly tool designed for improved reliability, ease of maintenance and increased accuracy in applying a specified torque to a fastener which is assembled to workpieces such as automobile bodies.

Conventional hand held production assembly tools are commonly used to secure fasteners, such as bolts or nuts, to specified torque levels during the assembly of products such as automotive bodies, subassemblies and systems. These tools are powered by a motor having an associated clutch mechanism that transfers torque from the motor to the output spindle of the tool. The motor drives the spindle which in turn engages and secures the fastener to the workpiece. When the tool has tightened the fastener to the preset torque level, the mechanical clutch mechanism in the tool disengages the motor drive from the output spindle. This clutch disengagement prevents the tool from further tightening the fastener and thus prevents overtightening of the fastener and/or damage to the assembly.

Hand held production assembly tools are commonly powered by compressed air via air lines that are releasably coupled to a connection fitting on the tool. Consequently, the convenience and maneuverability of the tools are frequently compromised by the need to be continuously tethered to a source of compressed air by the air lines.

While present compressed air powered production assembly tools provide acceptable performance, it is desirable to provide an electric powered tool, particularly a cordless electric battery powered tool, with comparable and/or improved performance. Previous attempts to produce an acceptable electric powered production assembly tool have encountered certain difficulties. For example, in present production assembly tools, the tool clutch may not reset to the engaged position subsequent to the fastener being secured and the motor being braked. Thereafter, when the operator attempts to install the next fastener, the tool control circuit will then sense the disengaged clutch position and will not initiate the fastening operation for driving of the next fastener. Moreover, the mere insertion in the control circuit of a time delay to give the clutch an opportunity to re-engage, may not be an adequate solution to the problem. For example, in order to ensure proper clutch re-engagement, the length of the required time delay period would be substantial for fasteners with a longer drive time while some fasteners with a shorter drive time will seat while the system is still disabled thereby overtightening the fastener.

In addition, when power is applied to the tool while the clutch is stuck in a disengaged position, the clutch may suddenly reengage causing the clutch sensor switch to bounce. This in turn causes the tool control circuit to falsely detect that the clutch has disengaged, thereby causing an untimely braking of the motor.

Further, the clutch mechanisms in conventional production assembly tools are designed to disengage upon reaching a preset level of torque. However, these clutch mechanisms will re-engage and disengage repeatedly until the motor has come to a stop thereby allowing over tightening of the fastener. An air powered tool is capable of a relatively quick stop due to the fact that once pressurized air is shut off to the tool, the continued rotation of the spindle attempts to draw a vacuum. In order for an electrical powered tool to approach the stopping speed of an air tool, the circuitry must switch the motor to reverse drive thus causing excessive loading and wear on the tool. Additionally, clutch disengagement sensing systems associated with the above conventional clutches cause the motor to be braked upon the tool reaching a preset torque limit. However, these disengagement sensing systems may cause the motor to be braked differently if the tool is securing a fastener to a soft joint rather than a hard joint, thus resulting in an inaccurate securing of the fastener.

Another problem associated with present production assembly tools is that the motors are typically difficult to access or service, as a significant amount of tool disassembly must be done to remove the motor. Once the motor has been repaired or serviced, it is often difficult to correctly reinsert and align the motor in the proper operating position within the tool.

Further, some present production assembly tools provide a readily accessible torque adjustment mechanism that permits the torque level to be easily adjusted by a tool operator. However, in applications in which fasteners must be set in a workpiece at a uniform torque, it may be undesirable to provide such a readily accessible torque adjustment mechanism, due to the possibility of unauthorized or inadvertent adjustments to the torque setting.

An additional difficulty with present production assembly tools is that it is often difficult to maintain proper lubrication of the tool, as many such tools require partial disassembly for proper lubrication of internal components. Many such tools alternatively include lubrication areas at certain locations on the outer tool housing. These areas allow internal components to be lubricated. However, these areas also permit dirt and other debris to more easily reach the internal tool components.

Another drawback of present production assembly tools concerns the tool housing. Because a typical tool outer housing is composed of a rough plastic or metal, if the tool is placed on a finished surface, it inadvertently scratches the surface. Thus, additional time and cost must be spent refinishing the surface. Often, a rubber boot is provided to cover the exterior of the housing. However, such a boot may be easily misplaced in an assembly plant environment. Further, the boot often becomes misaligned on the tool, causing difficultly in tool use and handling.

Further, numerous parts are assembled in such power production assembly tools. Additional tool features translate into additional tool parts, which in turn increase both tool cost and complexity.

The present invention comprises a hand held cordless electric battery power driven fastening tool having several improvements over presently available production assembly tools. These improvements include an improved control circuit, an improved clutch mechanism, a maintenance-related memory device, a clutch sensor switch system, a motor orientation system, a torque adjustment system, a non-marring molded laminated housing and components formed integrally with the tool housing.

The control circuit in the present invention includes circuitry to accurately sense clutch disengagement subsequent to the tool reaching a preset torque level by detecting a voltage change associated with a transition in the state of the clutch sensor switch from a stable closed position to an open position. The control circuit of the present invention also includes circuitry that prevents braking of the motor due to a clutch open condition caused when the clutch is stuck in a disengaged position. Further, the control circuit of the present invention includes circuitry that prevents the control circuit from falsely detecting a clutch open condition due to clutch sensor switch bounce. In addition, the control circuit disables the motor braking function when the motor is driven in reverse to remove a fastener.

The improved clutch mechanism includes a driving disk operatively connected to the tool transmission and a driven cam disk operatively connected to the tool spindle. The disks include three cooperating sets of recesses spaced 120° apart from one another. Circumferentially-arranged ramped surfaces connect the recesses of each disk. A bearing disk rotatably houses three ball bearings equally spaced 120° apart from one another. When the clutch mechanism is engaged, each ball bearing is rotatably trapped within one of the three cooperating sets of recesses in the cam disks. During securing of the fastener, when the tool preset torque level is reached, the ball bearings roll from the recesses, causing the cam disks to separate and cease transmitting torque thus disengaging the clutch. The driving disk continues to rotate due to the inertia of the system even though it is not driven by the tool motor, while the driven disk becomes grounded. The ball bearings roll, rather than slide, between the adjacent recess sets, thereby preventing the cam disks from re-engaging until the driving disk has rotated 240° relative to the stationary driven disk, rather than 120°. The additional 120° of driving disk rotation increases the accuracy, life and performance of the electrically driven tool without switching the tool into reverse drive. This additional rotational movement also allows the system's inertia to dissipate prior to reengaging the clutch thus minimizing the re-engagement torque spikes such that they are less than the initial disengagement torque. In addition, the driving disk is sandwiched between the three ball bearings and a thrust bearing therefore reducing friction and wear.

The clutch sensing system includes a membrane switch that is activated/deactivated by a plunger. Both the membrane switch and the plunger are mounted in a sensor block operatively connected between the clutch mechanism and the control circuit. In particular, the control circuit of the present invention accurately senses clutch disengagement upon the tool reaching a preset torque level by detecting the opening of the clutch sensor switch. The switch opening is calibrated to operate within a tolerance band based on the amount of torque which causes the axial displacement of the clutch disks. The clutch disengagement sensor may be mechanically adjusted for system calibration to thereby allow the motor to be braked within a particular range of clutch disk axial separation distances, thereby preventing situations in which the motor is prematurely braked or not braked at all thus increasing the accuracy of torque settings while driving hard and soft joints.

The motor orientation system includes a removable rear end cap that allows the motor to be disconnected and removed from the rear of the tool housing. Preferably, pins on the transmission housing mate with corresponding holes on the motor to prevent rotation of the motor housing. Proper orientation of the motor is ensured by the mating of features on the tool housing with corresponding features on the motor housing.

The torque adjusting system includes an indicator collar which is accessible from the exterior of the tool and includes a clutch setting display. The collar, when rotated to an adjustment position by an adjustment tool, allows access to a clutch adjustment nut located within the tool housing. Movement of the clutch adjustment nut through the use of the adjustment tool permits adjustment of the tool torque setting. The collar thereby minimizes unauthorized or inadvertent adjustment of the tool torque setting. The collar, when located in a non-adjustment position, seals the access ports for the adjustment tool to prevent contamination from entering the tool housing and indicates the torque level setting of the tool.

The non-marring molded laminated housing includes a self-sealing lubrication port which is formed by a molded first shot layer that is in turn covered by an overmold exterior layer. The first shot layer is formed within a housing mold to define an aperture in a predetermined location on the housing corresponding to the location of the inner components to be lubricated. The overmold exterior layer is dimpled over the aperture. A needled lubrication device is thus capable of puncturing the overmold layer over the aperture and depositing lubrication on the interior components of the tool. When the needle is removed, the material self seals, thereby preventing dirt and other foreign particles from entering the interior of the housing and applied lubrication from leaking.

The integrally-formed tool components are formed with the tool housing during the molding process used to manufacture the housing. Such components thereby reducing tool cost and the number of components required to assemble the tool.

BRIEF DESCRIPTION OF THE DRAWINGS

Additional objects and advantages of the present invention will become apparent from a reading of the following detailed description of the preferred embodiment which makes reference to the drawings of which:

FIG. 2 is a plan view illustrating interconnection of the power tool motor with the power tool transmission;

FIG. 3 is a front elevational view of the power tool motor in the direction of arrows 3—3 in FIG. 2;

FIG. 4 is a side view of the power tool shown in FIG. 1 with the side of the tool housing and the rear end cap removed;

FIG. 5 is a rear elevational view of the power tool motor inserted in the rear of the tool housing with the end cap being removed;

FIG. 8 is an enlarged cross-sectional view of the clutch mechanism, the torque adjustment collar and the decoupling sensor implemented in the nose portion of the FIG. 9 is an isolated view of the decoupling sensor switch of FIG. 8 shown in an open state;

FIG. 11 is a plan view of the clutch mechanism and torque adjustment collar shown in cross-section;

FIG. 12 is an exploded perspective view of the clutch plates of the clutch mechanism shown in FIG. 8;

FIGS. 13A–13C are schematic illustrations showing relative movement of the cam disks and the ball bearings in both the clutch engaged and clutch disengaged states;

DETAILED DESCRIPTION OF THE PREFERRED EMBODIMENT

Figures 1A, 1B:
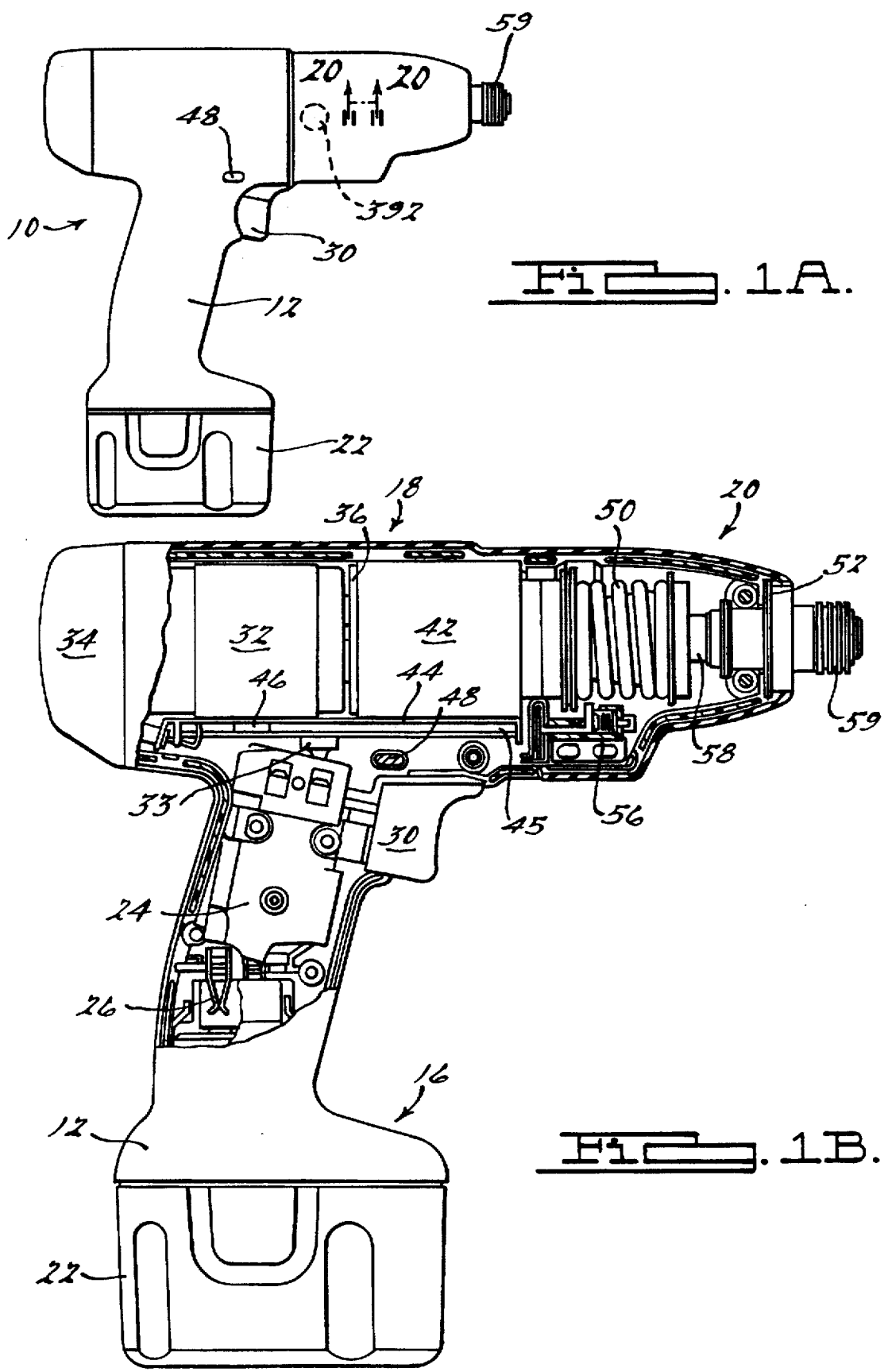
FIG. 1A is a side elevational view of the production assembly tool according to a preferred embodiment of the present invention.
FIG. 1B is a side elevational view, in partial cross-section, of the power tool of FIG. 1A.

Referring to the drawings. FIG. 1A illustrates a side elevational view of a production assembly tool shown generally at 10. The production assembly tool is designed to secure threaded fasteners such as nuts or bolts into a workpiece until the tool reaches a preset level of torque. At this preset level of torque, the clutch disengages and the tool motor is braked. The tool operates with a high degree of accuracy, thereby preventing over securing or under securing of the fastener. Further, the tool is designed for ease of calibration, maintenance and repair.

The production assembly tool 10 shown in FIG. 1B includes a housing 12. a portion of which is removed so as to reveal the inner components thereof. Outer housing 12 is preferably a two-piece clamshell-type housing formed from injection molded high density plastic material. However, housing 12 may be a jam pot type housing or any other type of housing commonly used in the art. The outer halves of housing 12 are preferably formed by a base first shot material and then covered by an overmold exterior. Preferably, the overmold exterior is a neoprene rubber compound that, if punctured, will automatically self-seal for reasons set forth below. The overmold layer bonds to the base first shot shell, thereby forming an integral housing shell that prevents scratching of finished surfaces when tool 10 is placed on such surfaces and thus eliminates the need for a separate tool rubber boot.

Housing 12 consists of three main sections: an elongated tool handle 16; a tool body 18 integrally connected with tool handle 16. and a nose 20 extending outwardly from tool body 18. Handle 16, body 18 and nose 20 each house tool components, the structure and operation of which are described below.

Elongated handle 16 includes a battery pack, shown generally at 22. Battery pack 22 preferably consists of commercially available NiCad rechargeable batteries. However, it should be appreciated that the power tool of the present invention may alternatively include a power cord for insertion into a standard 110 volt AC outlet. Battery pack 22 is operatively connected to a tool trigger mechanism 24 through a set of connectors 26. Trigger mechanism 24 includes a trigger 30 that, when depressed by a tool operator, closes a trigger switch 31 (FIG. 17A), causing power from battery pack 22 to energize the tool through a connector wire 33 in a manner well known to those skilled in the art.

Still referring to FIG. 1B, body 18 of the power tool houses a motor 32 removably secured in body 18 of housing 12 at its rear end by a removable rear end cap 34. At its front end, motor 32 is secured to an adaptor plate 36 in a manner described in detail below. A drive shaft 40 (FIG. 2) of motor 32 extends through adapter plate 36 and into contact with a transmission, shown generally at 42, housed within nose 20 of the tool.

Body 18 of the tool also includes a control circuit 44 mounted on a printed circuit board (PCB) 45. Control circuit 44 is operatively connected between trigger mechanism 24 and motor 32 for controlling operation of the tool in a manner that will be described in more detail below. A memory device for tracking tool usage parameters is also operatively connected to control circuit 44 and is shown generally at 46. In addition, a forward/reverse switch 48 is connected between motor 32 and control circuit 44 to allow a tool operator to selectively switch between fastener securing and loosening modes.

Nose 20 of the tool, in addition to housing transmission 42, houses a clutch mechanism, shown generally at 50. An externally accessible adjustment collar 52 is rotatably disposed within nose 20. A clutch adjustment tool, shown at 54 (FIG. 11), is used in conjunction with adjustment collar 52 for adjustment of the torque setting for the tool. Nose 20 also houses a decoupling sensor 56 for sensing disengagement of clutch mechanism 42 and communicating this sensed clutch disengagement to control circuit 44. A drive spindle 58, including a tool engaging portion 59, extends axially throughout nose 20 and is operatively connected to tool transmission 42. The structure and operation of clutch mechanism 42, adjustment collar 52 and decoupling sensor 56 will be described in greater detail below.

The structure and operation of the components encased within tool housing 12 will now be described. As shown in FIGS. 2 through 4, motor 32 is of the type well known to those skilled in the art. Preferably motor 32 is a conventional brushed-DC motor. However, any motor capable of being electromechanically braked may be implemented in the tool. Motor 32 is encased within a motor housing 60. Motor drive shaft 40 engages transmission 42 as described in detail below. Apertures 70 (FIG. 3) are formed on the inner face of motor housing 60. A pair of guide pins 72 are positioned on adaptor plate 36 located on the face of transmission 42. While being illustrated as being a part of adaptor plate 36, guide pins 72 could be placed on the inner face of motor housing 60 and apertures 70 formed on adaptor plate 36 to achieve the same results. Also, adaptor plate 36 could be eliminated and guide pins 72 or aperture 70 could be a part of transmission 42 if desired. Further, a C-shaped flux ring 74 encircles motor 32 within housing 12.

As motor 32 is inserted through the rear of tool body 18 of tool housing 12 toward housing nose 20, apertures 70 mate with pins 72 to thereby assure proper positioning of motor 32 within body 18 of housing 12. The mating of apertures 70 with pins 72 also prevents rotation of motor housing 60 during tool operation. As shown in FIGS. 3 and 5, a slot 77 in flux ring 74 engages a rib 78 integrally formed at the rear of body 18 of housing 12. Thus, engagement of rib 78 with slot 77 ensures that the positive and negative terminals of motor 32 are oriented correctly and not 180° out of position, as would be possible if only apertures 70 and pins 72 were implemented for motor alignment purposes. The proper orientation of the terminals of motor 32 ensure the correct wiring of motor 32. The two wires which attach to the terminals of motor 32 are different lengths such that only one of these wires can reach the top terminal of motor 32. Thus, by ensuring that the same terminal (plus or minus) of the motor is always at the top, proper wiring of motor 32 is achieved.

It should be noted that motor drive shaft 40 drivingly engages a pinion gear 62 of transmission 42 prior to insertion of motor 32 into housing 12. Pinion 62 may not engage the mating components of transmission 42 upon a first insertion of motor 32 into housing 12 and pinion 62 into transmission 42. However, a slight manual rotation of drive spindle 58 through tool engaging portion 59 will subsequently allow pinion 62 to engage transmission 42 as will be described below.

Referring now to FIGS. 4–7, interconnection of end cap 34 with motor 32 will be described in greater detail. After motor 32 is dropped into position in housing 12 and is in operative connection with transmission 42, end cap 34 is secured to the rear of housing 12. As shown, a rubber ring 76 is inserted over a rearward end 80 of motor 32. Rubber ring 76 is compressed between an end cap interior cylindrical projection 82 and end 80 of motor 32 to provide a tight engagement between motor 32 and end cap 34 and thus allows end cap 34 once secured to housing 12, to bias motor 32 towards front nose 20 of housing 12 against transmission 42 and ensure proper alignment of motor 32 as described above. The end of projection 82 which interfaces with rubber ring 76 is provided with a plurality of teeth which engage rubber ring 76 to prohibit rotation of motor 32 and the subsequent loading on pins 72. The alignment of motor 32 is provided by rearward end 80 of motor 32 being piloted by cylindrical projection 82.

As shown in FIGS. 4 and 5, end cap 34 defines a plurality of screw apertures 84. A plurality of screws 86 are inserted through screw apertures 84 and threadably engage a plurality of apertures 90 located within a retaining ring 88. Screws 86, when tightened, fasten end cap 34 to the rear of housing 12 compressing rubber ring 76. End cap 34 further includes a vented area 92 for motor 32 that permits air to circulate through housing 12 while preventing dirt and other debris from entering housing 12. In addition, end cap 34 defines an LED window 94 in which an LED DS1 (FIG. 4) connected with control circuit 44 of the present invention is seated for purposes described below.

Thus, it should be appreciated that end cap 34 is designed to form fit over the rear end of housing 12 to secure motor 32 within housing 12 and to protect motor 32 from damage. The tongue and groove joint between end cap 34 and housing 12 eliminates the need to incorporate a transversely extending screw at the rear of housing 12 thus eliminating the screw bosses associated with this type of attachment. It should further be appreciated that the removal of rear end cap 34 allows motor 32 to be removed and replaced without the need for splitting clamshell housing 12. Thus, removable end cap 34 provides easy access to motor 32, thereby allowing motor 32 to be more easily serviced and repaired. In addition, removable end cap 34, in combination with the above described motor alignment mechanism (apertures 70, guide pins 72 and rib 78), eliminates the chance of tool mis-assembly when motor 32 is reinserted into housing 12 after servicing or repair. Thus, removable rear end cap 34 provides a desirable alternative to serviceable brushes.

Figure 7:
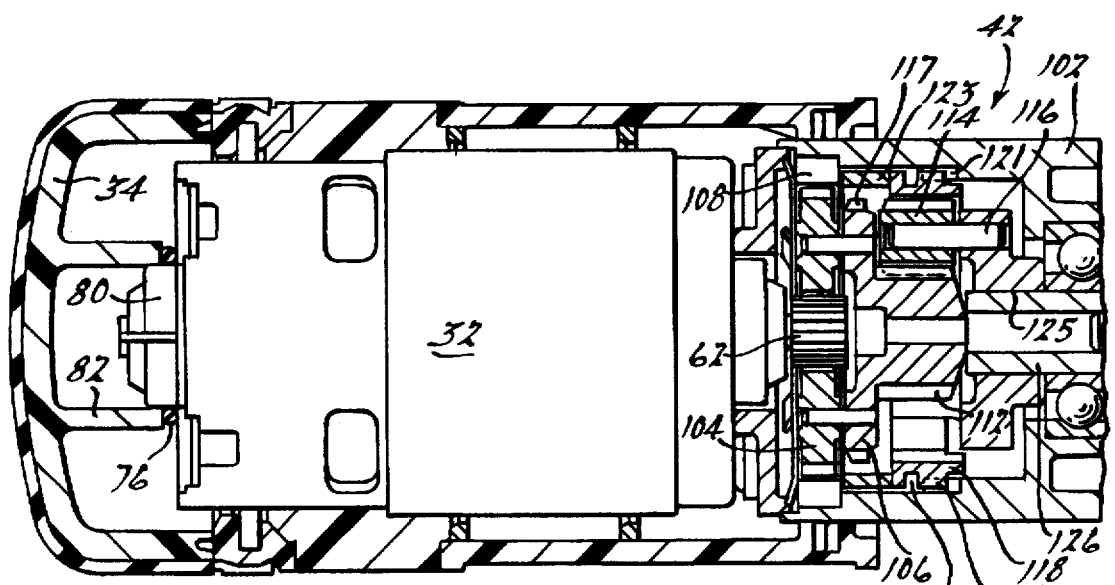
FIG. 7 is a plan view showing the planetary gear transmission of the present invention in cross-section.

Referring to FIG. 7, transmission 42 of the present invention is shown in cross-section. Transmission 42 is preferably a two stage planetary gear transmission including a stationary housing 102 which houses pinion gear 62, which forms the first sun gear which meshes with a first stage set of planet gears 104 journalled for rotation about their axes on a first stage carrier 106. A first stage ring gear 108 is fixed within housing 102. First stage ring gear 108 has internal teeth which mesh with first stage planet gears 104. First stage carrier 106 includes a spur gear 112 which forms the second sun gear for driving a second stage set of planet gears 114. Second stage planet gears 114 are journalled for rotation about their own axes on a second stage carrier 116. A second stage ring gear 118 includes internal gear teeth for meshing with second stage planet gears 114. Further, second stage planet ring gear 118 includes an external circumferential groove 122 for switching transmission 42 between high and low speeds. A spacer 123 locks transmission 42 of the present invention into a low speed output mode. Second stage carrier 116 in turn includes a cylindrical bore 125 that engages with a shaft 126 of a driver dog 128 for driving the clutch 50. As shown in FIG. 8, driver dog 128 includes a pair of flanges 132 that engage clutch mechanism 50 as will be described in more detail below.

It should be appreciated that spacer 123 prevents second stage ring gear 118 from being moved leftward into engagement with first stage carrier 106 and thus into a high speed position. The tool, however, could be designed to provide a high/low speed switch (not shown) external to housing 12 and having fingers for engagement with groove 122 of second stage ring gear 118 to provide selective switching of transmission 42 between high and low speeds.

In low speed operation, motor 32 drives pinion 62 which in turn rotates first stage planet gears 104 which in turn rotate about their axes and a central axis within first stage ring gear 108. As a result, first stage carrier 106 rotates at a speed less than the rotational speed of pinion 62. This provides a first stage speed reduction. Second stage ring gear 118 is maintained in the low speed position as shown by spacer 123. Internal teeth on second stage ring gear 118 are thus disengaged from first stage carrier 106. A plurality of teeth 119 on the outside of second stage ring gear 118 engage a plurality of teeth 121 in transmission housing 102, thereby locking second stage ring gear 118 in housing 102. Second stage planet gears 114 driven by spur gear 112 subsequently rotate about their axes and also rotate about second stage ring gear 116, thereby providing a second stage reduction in speed to second stage carrier 116 and thus to drive dog 128.

High speed operation (if it is provided for) is achieved by eliminating spacer 123 and shifting second stage ring gear 118 to the left in the drawing. In high speed operation motor 32 drives pinion 62 which in turn rotates first stage planet gears 104 which in turn rotate about their axes and a central axis within first stage ring gear 108. As a result, first stage carrier 106 rotates at a speed less than the rotational speed of pinion 62. This provides a first stage speed reduction. With second stage ring gear 118 shifted leftward in the drawing in a high speed position, the internal teeth on second stage ring gear 118 mesh with teeth 117 of first stage carrier 106. Second stage ring gear 118 is thus locked onto first stage carrier 106 and rotates therewith. Second stage planet gears 114 thus do not rotate about their own axes, but rather transmit rotation of first stage carrier 106 to second stage carrier 116. Therefore no second stage speed reduction is achieved and high speed operation of transmission 42 is achieved.

Referring now to FIGS. 8 through 14, the structure and operation of clutch mechanism 50 of tool 10 of the present invention will be described in greater detail. A driving cam disk 142 is located adjacent to and in driving relationship to driver dog 128 of transmission 42 and includes drive lugs 144 for engaging driver dog flanges 132. In the preferred embodiment, there are two flanges 132 and two drive lugs 144. Flanges 132 and lugs 144 are sized to provide a lost motion type of drive between transmission 42 and clutch 50. This lost motion drive aids in the dissipation of the inertial energy of tool 10 upon braking of motor 32. Driving cam disk 142 includes a circumferential recess 146 around an aperture 148 for rotatably housing a plurality of ball bearings 150, only two of which are shown in FIG. 8. Ball bearings 150 rotatably contact drive spindle 58, which includes a twelve tooth involute spline 152 and which extends through aperture 148 in driving cam disk 142, to reduce friction between driving cam disk 142 and drive spindle 58 similar to the operation of a thrust bearing.

As shown in phantom in FIG. 12, driving cam disk 142 has a front surface defining three detentes 154a–c evenly spaced 120° apart from one another and interconnected by a circumferential ramped channel 156. Detentes 154a–c are in communication with three ball bearings 158a–c, which are also rotatably housed 120° apart from one another within a bearing disk 160.

A driven cam disk 164 is located opposite driving cam disk 142. As with driving cam disk 142, driven cam disk 164 includes three cam disk detentes 166a–c spaced 120° from one another and in communication with ball bearings 158a–c. Detentes 166a–c are also interconnected by a circumferential ramped channel 168 that matches channel 156. Drive spindle 58 projects through an aperture 148 in driving cam disk 142 and an aperture 171 in bearing disk 160 and is rotatably connected to driven cam disk 164 through the meshing of spindle spline 152 with an internal spline 172. As shown in FIGS. 8 and 11, driven cam disk 164 is biased toward driving cam disk 142 by a coil spring 176, and, when driven by driving cam disk 142, rotates spindle 58. Coil spring 176 is fitted over drive spindle 58 and is biased rearwardly toward driven cam disk 142 by a threadable torque adjustment nut 180. In combination, torque adjustment nut 180 and coil spring 176 set the torque level at which cam disks 142 and 164 axially separate and stop transmitting torque. Clutch 50 is shown in an engaged position in FIG. 8 and in a disengaged position in FIG. 9.

In operation, torque adjustment nut 180 is adjusted, in a manner described in detail below, to compress coil spring 176. Compressed coil spring 176 in turn urges driven cam disk 164 toward driving cam disk 142. Below the clutch preset torque value, each of ball bearings 158a–c nest within a corresponding recess set defined by detentes 154a–c and 166a–c, thereby facilitating rotation of cam disks 142 and 164 and thus driving spindle 58. Driven cam disk 164 and driving cam disk 142 rotate in unison as motor 32, through transmission 42, rotates driving cam disk 142 and driven cam disk 164 through ball bearings 158a–c. Because driven cam disk 164 is connected to spindle 58, driven cam disk 164 thereby rotates spindle 58 at a speed determined by transmission 42. The spindle 58 in turn rotates, and when in engagement with a fastener through spindle head, secures a fastener to a workpiece.

When the tool reaches its preset torque value, i.e., when the torque applied to driving cam disk 142 exceeds the resistance applied to driven cam disk 164 by the fastener, driving cam disk 142 rotates relative to driven cam disk 164. Subsequently, ball bearings 158a–c roll out of detente sets 154 and 166 and into matched ramped channels 156 and 168. This movement axially displaces driven cam 164 to disengage driven cam disk 164 from driving cam disk 142 and moves driven cam disk 164 axially forward toward nose 20 of housing 12, thereby opening decoupling sensor switch 56 in a manner described in detail below. The open decoupling sensor switch 56 subsequently causes control circuit 44 to brake motor 32. Detents 154 and 166 have been found to provide improved performance and accuracy over the prior art male cam surfaces. This is due to the face that the female detents 154 and 166 represent the position of least potential energy and the system thereby will inherently come to rest with balls 158 being seated in detents 154 and 166. With balls 158 being located within detents 154 and 166 at the beginning of each torque cycle the production tool of the present invention provides improved accuracy, performance and repeatability due in part to the system beginning each torque cycle at the same starting position. The incorporation of female detents 154 and 166 in place of prior art male cam surfaces also provides improved manufacturing and wear characteristics of the components especially when the components are manufactured using powdered metal technology. During manufacture, the incorporation of female detents inherently creates a higher density of material located within the female detent. Since the female detent is also the area of highest loading caused by balls 158, the strength, durability and performance is increased.

FIGS. 13A–13C illustrate, in a straight line manner, the engagement, disengagement and subsequent re-engagement of driving cam disk 142 and driven cam disk 164 as described above. In FIG. 13A, ball bearings 158a–c are nested within cam disk detentes 154a–c and 166a–c, respectively, as the tool secures a fastener to a workpiece below the tool preset torque level by rotating in the direction of arrow 167. Therefore, driving cam disk 142 is engaged with driven cam disk 164 through ball bearings 158. As the preset level of torque is reached, ball bearings 158a–c are urged out of corresponding detents 154 and 166 to a position between detents in matched channels 156 and 168, as shown in FIG. 13B. Ball bearings 158 roll up a forward cam surface 181 which is located on the forward side of each detent 154 and 166. Cam surface 181 is designed to control the load at which axial movement of driven cam disk 164 moves as a function of the torque applied to clutch 50. The loading by coil spring 176 will always be directed axially and will attempt to keep driven disk 164 loaded against ball bearings 158 and thus against driving disk 142. The shape of surface 181 is designed such that the maximum component of the torque load which acts against the load exerted by spring 176 occurs at a point near the upper portion of surface 181. In this manner, the resultant load exerted between ball 158 and surface 181 will decrease as ball 158 moves to the upper portion of surface 181. This lower resultant load increases the life of clutch 50 due to the fact that the radius of curvature of surface 181 is smaller at its upper portion. When positioned within matched channels 156 and 168, ball bearings 158a–c force the driven cam disk axially forward, and thus disengage driving cam disk 142 from driven cam disk 164 as shown in FIG. 11. Control circuit 44 subsequently brakes motor 32 as is described below.

Once clutch 50 disengages, driven cam disk 164 is rotationally grounded, while driving cam disk 142 continues to rotate until motor 32 is completely braked. The subsequent continued rotation of driving cam disk 142 relative to driven cam disk 164 at this point causes ball bearings 158a–c to track within ball channels 156, 164 partially with respect to rotating driving cam disk 142 and partially with respect to grounded driven cam disk 164. Therefore, ball bearings 158 track at only one-half the rotational velocity of rotating driving cam disk 142.

For example, upon clutch engagement, ball bearing 158a is forced out of the recess set consisting of detentes 154a and 166a as driven cam disk 164 is grounded and driving cam disk 142 continues to rotate. Ball bearing 158a then tracks in matched channels 156, 168 at one-half the rotational speed of driving cam disk 142. As shown in FIG. 15B, as driving cam disk 142 continues to rotate as motor 32 is braked, detent 154c becomes aligned with detent 166a. However, because ball bearing 158a has not yet reached the corresponding detent 166b on grounded driven cam disk 164, ball bearing 156a does not become nested. After an additional 120° of rotation of driving cam disk 142, detent 154c catches ball bearing 158a as ball bearing 158a reaches detent 166b. Thus, ball bearing 158a, which initially was nested within the detent set consisting of detentes 154a and 166a, becomes nested within the detent set consisting of detentes 154c and 166b subsequent to a 240° rotation of the driving cam disk 142 relative to driven cam disk 164. The ball bearings 158b and 158c track in a manner identical to the ball bearing 158a.

Thus, it should be appreciated that clutch 50 of the present invention provides a 240° rotation of driving cam disk 142 subsequent to the disengagement of clutch 50, as opposed to the 120° rotation characteristic in similar conventional clutch mechanisms. The additional 120° of rotation upon disengagement of clutch 50 provides additional motor braking time, thereby ensuring that the inertia of the system is reduced to a point where subsequent re-engagement of cam disks 142 and 164 will cause a torque spike which will not exceed the value of torque required to initially disengage clutch 50. In prior art production assembly tools, the re-engagement and disengagement of the clutch will create torque spikes some of which may be greater than the initial disengagement torque. The initial disengagement torque is a predictable and controllable parameter. Any subsequent torque spikes which exceed this initial disengagement torque are unpredictable thus leading to an improperly tightened fastener. The present invention, by ensuring that any subsequent torque spikes are lower than the initial disengagement torque, improves the performance and accuracy of the production assembly tool. Clutch 50 of the present invention prevents the inadvertent additional tightening of a fastener due to the inertia of the system generating excessive torque spikes upon the continued re-engagement of clutch 50. Matched channels 156 and 168 are ramped channels in that once ball 158 has moved up cam surface 181 and into channels 156 and 168 it is a downward incline to the next detent. In the preferred embodiment, channels 156 and 168 increase in depth by 0.003 inches over the distance between detents. This downward incline helps to move balls 158 into the next set of detents and also acts against any rearward motion between driven disk 164 and driving disk 142. The downward incline of channels 156 and 168 also ensures that fasteners of small inertial accelerated to low spindle speeds will generate enough torque to overcome the system's friction and rest balls 158 back in detents 154 and 166 in the event of a stuck open clutch. Detents 154 and 166 each also define a rear cam surface 183 which guides ball 158 back into a respective set of detents 154 and 166. Rear cam surface 183 and front cam surface 181 in reverse operation is designed to ensure contact between balls 158 and both cam disks 142 and 164 during re-engagement to eliminate any jumping of balls 158 which may have a tendency to peen forward cam surface 181. In addition, rear cam surface is designed, in the preferred embodiment, to provide an increase of 5% of the forward disengagement torque when the tool is driven in reverse to facilitate the removal of a fastener if desired.

Figure 14:
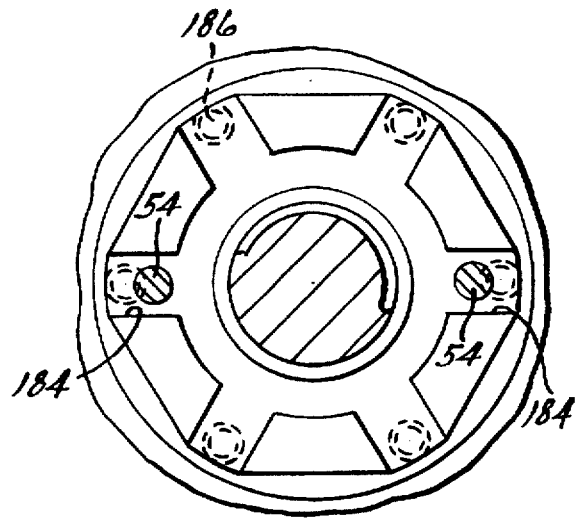
FIG. 14 is a cross-sectional view of the threaded nut of FIG. 11 taken along line 14—14.

Referring to FIGS. 8 and 11, drive spindle 58 includes a threaded portion 182 on which adjustment nut 180 is threaded. Adjustment nut 180 controls the amount of compression of coil spring 176, and thus the torque setting of clutch 50. As shown in FIG. 14, the face of adjustment nut 180 includes three pairs of opposing slots 184 allowing engagement with torque adjustment tool 54. Adjustment nut 180 also includes a plurality of nipples 186 located around its outer edge on the surface opposite to slots 184 in lockable engagement with a plurality of corresponding recesses 188 in a detent cup 190. Detent cup 190 includes an interior aperture which defines a twelve tooth involute spline 192 for engaging the teeth of spline 152 on spindle 58 to thereby releasably secure nut 180 to spindle 58 and prevent rotation of nut 180 relative to spindle 58 as spindle 58 rotates. The position of adjustment nut 180 on threaded portion 182, and thus the torque level setting of the tool, may be adjusted after manipulation of collar 52, which is described in detail below.

Figure 15:
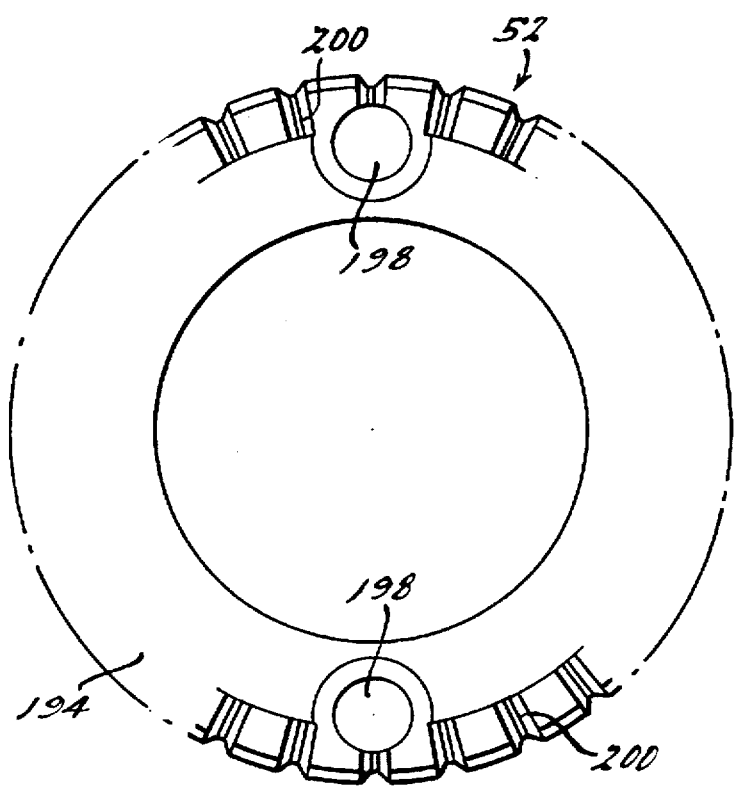
FIG. 15 is a front elevational view of the torque adjustment collar of the present invention.
Figure 16:
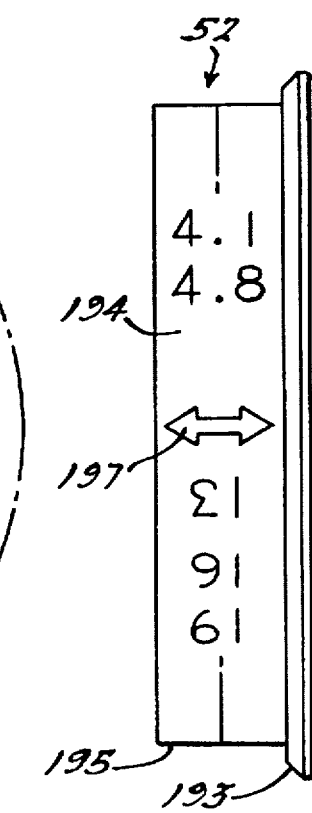
FIG. 16 is a plan view of the torque adjustment collar of the present invention.

Referring to FIGS. 8, 15 and 16, collar 52 and associated components of the present invention are shown in greater detail. As shown in FIGS. 15 and 16, collar 52 includes a ring 194 rotatably trapped within nose 20 of housing 12 through engagement with a collar lip 193 with an inner channel formed within nose 20 of housing 12. The periphery 195 of ring 194 is labelled with torque settings in both in/lbs and N·m. As shown in FIG. 11, a clutch torque window 196 is integrally molded into housing 12 above ring 194 for displaying a particular clutch torque setting or for indicating that collar 52 has been rotated to an adjustment mode, as represented by the arrow symbol 197. As shown in FIG. 15, the face of ring 194 includes a pair of adjustment apertures 198 for allowing interior access to adjustment nut 180. The face of ring 194 further includes a plurality of notches 200 evenly spaced from one another. Notches 200 selectively cooperate with a detent spring 202 (FIG. 8) to cause collar 52 to ratchet when rotated, as spring 202 engages with successive notches 200, and to retain the position of collar 52 once the desired torque setting or torque adjust symbol is displayed in window 196.

Figure 10:
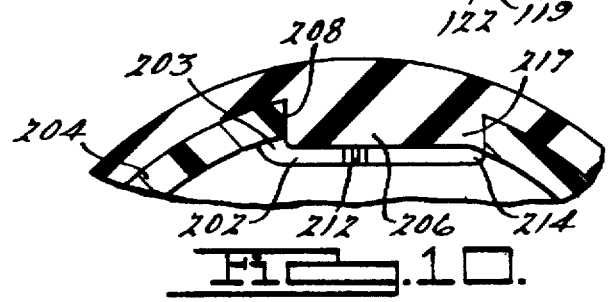
FIG. 10 is a front elevational view of a leaf spring shown in FIG. 8 and formed integrally with the tool housing.
Figure 6:
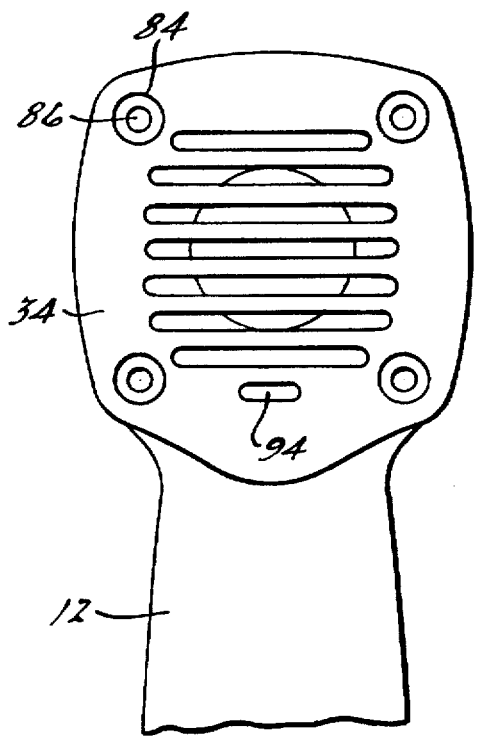
FIG. 6 is a rear elevational view of the rear portion of the power tool of FIG. 1A showing the connection of the rear end cap to the housing.

As shown in FIG. 10, detent spring 202 includes a first end 203 integrally formed with housing inner wall 204. As shown in FIG. 10, spring 202 extends laterally across housing 12 and defines a cavity 206. The first shot material forming housing 12 defines an aperture 208 in communication with cavity 206. Spring 202 includes a contact flange 212 for successively contacting notches 200 and a second end 214 that abuts, and flexes axially along, inner wall 204 when collar 52 is rotated as described below. The structural integrity of spring 202 is increased by the overmold material, shown at 217, which bonds to spring 202. The overmold material flows through aperture 208 and into cavity 206 to bond with spring 202 upon application of the overmold material to the outer surface of the inner first shot layer. If additional flexural strength of spring 202 is required, second end 214 can easily be formed integrally with housing inner wall 204. Because detent spring 202 is integrally formed during the housing molding process as part of housing 12, tool assembly and cost are reduced, as fewer parts are required.

To adjust the torque setting of tool 10, collar 52 is first rotated. As collar 52 is rotated, contact flange 212 is ratcheted into successive notches 200 on collar 52 with each notch 200 corresponding to a specific preset torque level indicator reading in window 196. Collar 52 is rotated until torque adjustment mode arrow 197 appears in clutch torque window 196. When collar 52 is rotated to the torque adjustment position, ring adjustment apertures 198 will be in alignment with a pair of housing adjustment apertures 216 located on a housing interior wall 220 (FIG. 11).

Once apertures 198 and 216 are aligned, the ends 222 of clutch adjustment tool 54 are inserted into the aligned apertures to engage one of the slot pairs 184 of adjustment nut 180. As partially shown in FIG. 11, torque adjustment tool 54 is preferably a circular cross-section length of semi-rigid wire capable of insertion into one of the slot pairs 184 formed in the face of nut 180. As adjustment tool 54 engages and holds nut 180 stationary, spindle 58 is rotated either counterclockwise or clockwise to thereby move adjustment nut 180 up or down along threaded portion 182 of spindle 58, dependant upon whether a higher or lower torque setting is desired. After adjustment nut 180 is rotated, adjustment tool 54 is then removed, and the production assembly tool is tested on a torque measurement device to determine the adjusted torque level of the tool. If the resulting torque level is too high or too low, adjustment tool 54 is again inserted through aligned apertures 198 and 216 to rotate adjustment nut 180 accordingly.

This process is repeated until a desired tool torque level is reached. Once this desired torque level is reached, collar 52 is ratcheted using tool 54 until the correct tool torque level setting is shown in window 196. Rotation of collar 52 in this manner also acts to seal adjustment apertures 216 to prevent dirt and other foreign substances from entering the interior of the tool subsequent to adjustment of the torque level.

It should be appreciated at this point that collar 52 described above aids in preventing an end user from adjusting the clutch torque setting. Therefore, a desired torque level setting may be set at a remote test station and thereafter maintained until it is desired to change the torque level setting again at the remote test station. Further, collar 52 obviates the need for torque adjustment access holes that openly expose the interior of the tool to dirt, grime and other debris common in an industrial assembly line setting, as collar 52 is rotated to seal the interior of the tool. In addition, collar 52 indicates the torque level at which the tool is set through window 196 on housing nose 20. Further, through window 196, collar 52 also indicates to a person setting the clutch torque level when the tool is in a torque adjustment mode.

Figure 17A:
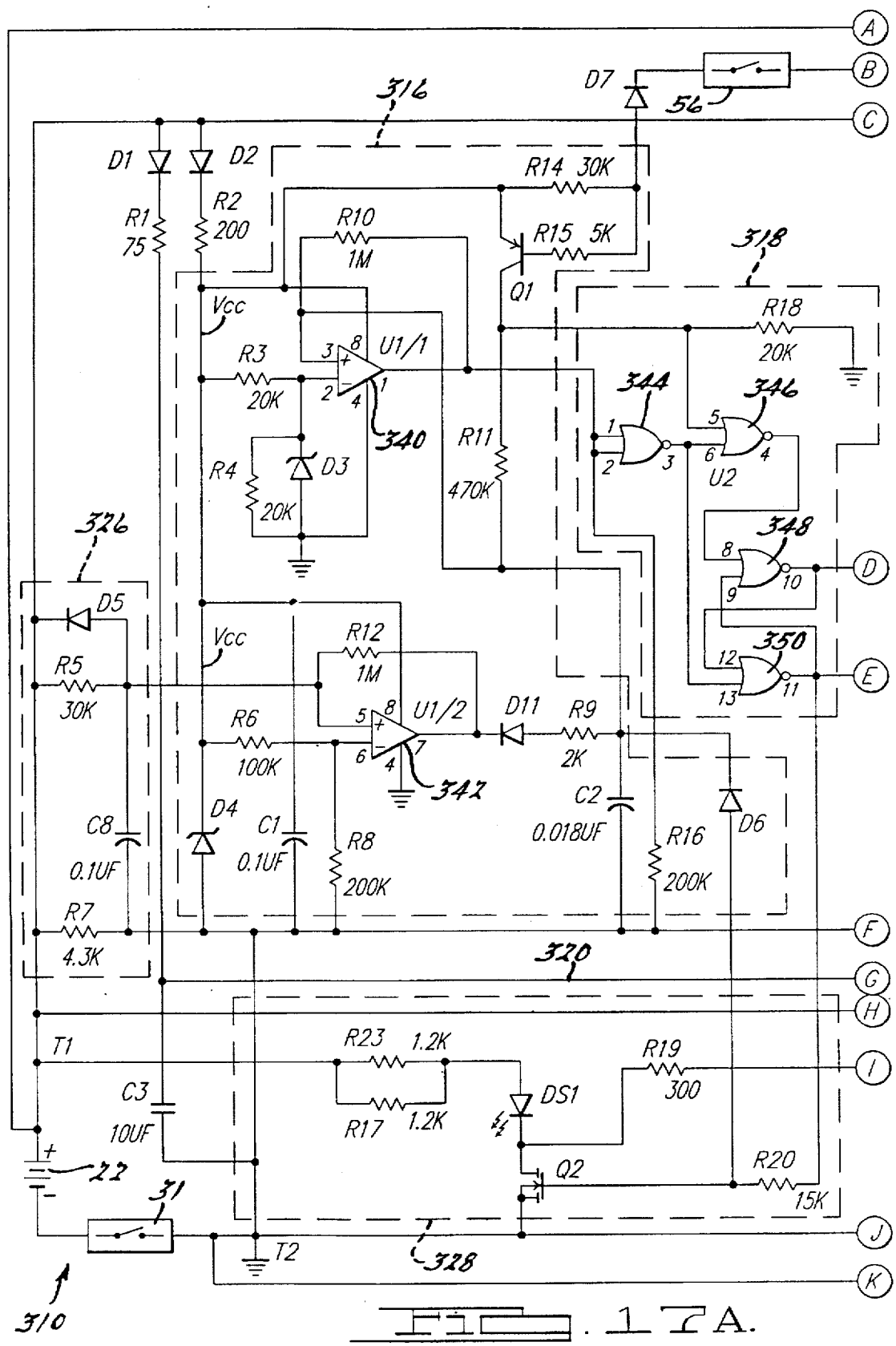
FIG. 17A–17B are schematic diagrams of the control circuit implemented in the present invention.
Figure 17B:
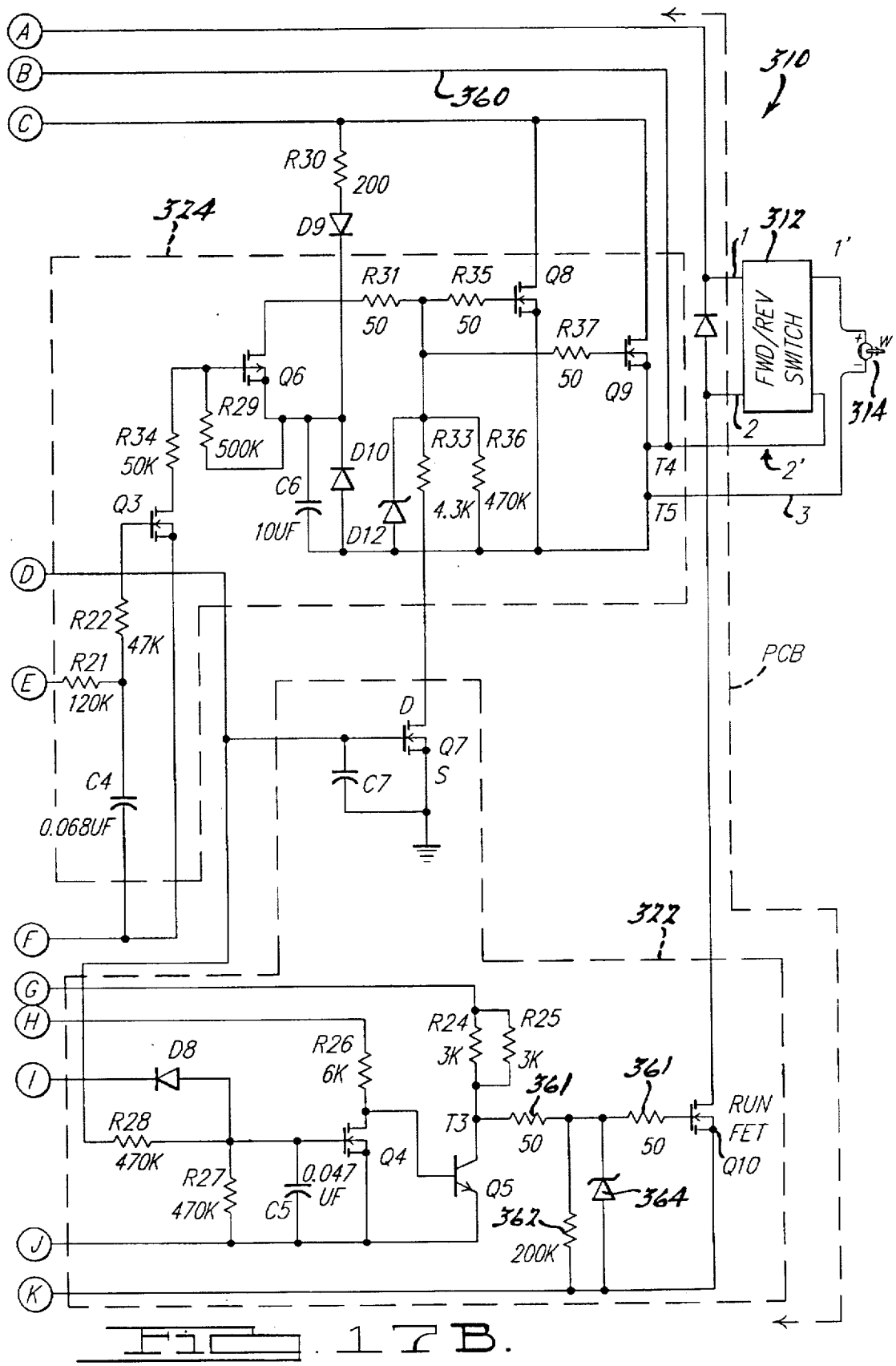

Referring now to FIGS. 17A–17B, a circuit diagram of control circuit 44 according to a preferred embodiment of the present invention is shown. As will be described in more detail below, power is selectively supplied to RUN mode circuitry implemented in the control circuit of the present invention. The RUN mode circuitry energizes motor 32 to drive a fastener. The power tool drives the fastener until a predetermined level of torque is reached and clutch 50 associated with the power tool disengages, preventing the power tool from applying further driving torque to the fastener. Clutch sensor switch 56 connected to control circuit 44 senses disengagement of clutch 50 by switching from a closed to an open state. Thereupon, power to the motor is interrupted and BRAKE circuitry in control circuit 44 dynamically brakes motor 32. Control circuit 44 includes protection circuitry that prevents both the RUN and BRAKE circuits from being simultaneously energized, a condition that would burn out the circuitry.

Upon power shut-off and braking of motor 32, clutch 50 normally reengages. However, if clutch 50 becomes stuck, control circuit 44 of the present invention is able to recognize this condition and give clutch 50 an opportunity to re-engage after energy is reapplied to motor 32. Control circuit 44 also includes circuitry for debouncing the trigger switch as well as the clutch sensor switch so that false termination signals are ignored.

Control circuit 44 of the present invention accomplishes these functions by implementing a "smart" time delay, that is initiated by the stable closing of the clutch sensor switch. Thereafter, control circuit 44 detects the transition in the clutch sensor switch from a stable closed position to an open position in response to clutch disengagement. This so-called "smart" delay also ensures against a false response to clutch sensor switch bounce as will be described in more detail below.

Further, control circuit 44 of the present invention also reduces the number of wire connections between the control circuit, the motor, the clutch sensor switch, and the forward/reverse trigger switch, thereby reducing the manufacturing cost of the control circuit.

Referring to FIGS. 17A–17B of the drawings, a power tool control circuit according to a preferred embodiment of the present invention is shown generally at 310. The control circuit 310 is fabricated in a manner well known in the art. Connecting pads, indicated generally at T1 and T4, operatively connect the controller to a forward/reverse switch 312. The forward/reverse switch 312 is connected to and controls the direction of rotation of the motor 314. The control circuit is also operatively connected to a trigger switch 31 that energizes the control circuit when depressed and de-energizes the circuit when released. While the control circuit described below is implemented with discrete components in the preferred embodiment of the present invention, it should also be appreciated that the control circuit could alternatively be implemented using a microcontroller of the type well known in the art. Additionally, it should be noted that the values shown for each of the discrete components of the circuit 310 of FIGS. 17A–17B are in accordance with the preferred embodiment of the present invention. Although these values may vary according to a particular application, the indicated values allow the circuit to operate in a manner described in detail below.

The control circuit 310 of the present invention consists generally of six subcircuits. Subcircuit 316 is connected to the clutch sensor switch 56 and monitors the state of the switch. Subcircuit 316 also implements the so-called "smart" delay function of the present invention to be described in greater detail below. Logic subcircuit 318 is connected to the output of subcircuit 316 and controls the RUN and BRAKE modes of the power tool motor. A RUN subcircuit, indicated generally at 322, is selectively enabled to control the running of the power tool motor in response to signals received from logic circuit 318. Similarly, a BRAKE subcircuit, indicated generally at 324, selectively controls the dynamic braking of the power tool motor in response to signals received from logic circuit 318. The outputs of both the RUN and the BRAKE subcircuits 322 and 324 are connected to the inputs of the forward/reverse switch 312 to control operation of the power tool motor.

In addition, filter subcircuit 326 filters voltage spikes caused by motor brush bounce, as well as any back-emf noise introduced into the circuit from the power tool motor. Lastly, subcircuit 328 includes an LED indicator for providing the operator with a visual indication when the desired torque level has been attained and the clutch has disengaged.

The particular components of the forward/reverse switch 312, the decoupling sensor switch 56 and each of the aforementioned subcircuits will now be described in more detail. Referring now to the forward/reverse switch 312, line 1 is connected directly to the positive terminal of the battery pack 22 while line 1' is connected to the high input of the tool motor 314. Line 2 is connected to the drain terminal of the RUN FET Q10 while lines 2' and 3 are connected to the source terminals of both BRAKE FETs Q8 and Q9. When the motor is operated in the forward RUN mode, a first switch internal to the forward/reverse switch 312 connects lines 1 and 1' and a second switch internal to the forward-reverse switch 312 connects lines 2 and 2'. When the motor is operated in the reverse RUN mode, the first switch connects lines 1 and 2', and the second switch connects lines 2 and 1'.

The clutch sensor switch 56 is connected to line 2' of the forward/reverse switch 312. The clutch sensor switch 56 is also connected through a diode D7 and a resistor R15 to the base of a transistor Q1 in subcircuit 316, and to the emitter of Q1 through a resistor R14. The collector of Q1 in turn is connected to a capacitor C2 through a resistor R11. Through these connections, Q1 is turned on when the clutch sensor switch 56 is closed and is turned off when the clutch sensor switch 56 is open. Sensor switch 56 is closed when the clutch is engaged and open when the clutch is disengaged.

Referring now to the subcircuit 316, a comparator 340 has its positive input connected to capacitor C2. The negative input of comparator 340 is supplied with a fixed reference voltage from $V_{cc}$ via a voltage divider network comprised of resistors R3 and R4 and zener diode D3. The output of comparator 340 is therefore adapted to switch from a low to a high state when the charge on capacitor C2 exceeds the reference voltage level supplied to its negative input. A second comparator 342 has its inverting input connected to $V_{cc}$ through a voltage divider consisting of resistors R6 and R8, and zener diode D4. The non-inverting input of comparator 342 is connected to the battery 22 via filter circuit 326 comprised of resistors R5 and R7, capacitor C8 and diode D5. The output at pin 7 of comparator 342 is fed back to its non-inverting input through resistor R12. In addition, the output of comparator 342 is connected through diode D11 and resistor R9 to capacitor C2. The output of the comparator 342 is normally high when the trigger switch 31 is actuated and low when the trigger switch 31 is released. Hence, when the output of comparator 342 is high, diode D11 is back biased and capacitor C2 is able to charge through resistor R11 whenever transistor Q1 is conductive. However, when the output of comparator 342 is low, the charge on capacitor C2 is rapidly dissipated through resistor R9 and diode D11 to ground.

The output of comparator 340 is supplied to subcircuit 318 and in particular to both inputs of a NOR gate 344. NOR gate 344 thus inverts the signal from comparator 340. The output of NOR gate 344 is connected to one input of NOR gate 346 and also to one of the inputs of NOR gate 350. The other input of NOR gate 346 is tied to the collector of the transistor Q1 and to ground through a resistor R18. The output of NOR gate 346 is connected to one of the inputs of another NOR gate 348. NOR gates 348 and 350 are connected in a R-S flip-flop configuration with the pin 8 input of NOR gate 348 corresponding to the set input and the pin 13 input of NOR gate 350 corresponding to the reset input. The "1" output of the flip-flop, corresponding to the output of NOR gate 348 at pin 10, is connected to the RUN subcircuit 322 to be described in more detail below. The "0" output of the flip-flop, corresponding to the output of NOR gate 350 at pin 11, is connected to the BRAKE subcircuit 324, and also to the gate of FET Q2 through a resistor R20.

Turning to the RUN subcircuit 322 shown in FIG. 19B, the output of NOR gate 348 is supplied through a time delay filter, consisting of resistors R27 and R28 and a capacitor C5, to the gate of a FET Q4. The drain of the FET Q4 is connected through a resistor R26 to the battery 22, and the source of the FET is connected to ground. Additionally, the drain of FET Q4 is connected to the base of a transistor Q5. The collector of transistor Q5 is connected to the battery supply line 320 via parallel resistors R24 and R25, and its emitter is connected to ground. In addition, the collector of transistor Q5 is also connected to the gate of the RUN FET Q10 through a series pair of 50 ohm resistors 361. The drain of the RUN FET Q10 in turn is connected to line 2 of the forward/reverse switch 312 and its source is connected to ground. Accordingly, when the output of NOR gate 348 in logic circuit 318 goes high, switching FET Q4 is rendered conductive, thereby turning off transistor Q5 and enabling RUN FET Q10 to energize the motor. Conversely, when the output of NOR gate 348 is low, switching FET Q4 is turned off and transistor Q5 is turned on, thereby disabling RUN FET Q10 and interrupting power to the motor. The time delay filter circuit connected between the output of logic circuit 318 and the gate of FET Q4 serves to debounce the trigger switch 31 before the RUN mode is initiated.

Referring now to the BRAKE subcircuit 324, the output from NOR gate 350 from logic circuit 318 is supplied through a time delay circuit comprised of resistor R21 and capacitor C4 to the gate of FET Q3. The drain of FET Q3 is connected through resistor R34 to the gate of FET Q6 and the source of FET Q3 is connected to ground. Similarly, the source of the FET Q6 is connected to the battery 22 through diode D9 and resistor R30 and the drain of the FET Q6 is connected through resistors R31, R35 and R37 to the gates of the parallel-connected BRAKE FETs Q8 and Q9. The drains of both FETs Q8 and Q9 are connected directly to the battery 22 and the sources of both BRAKE FETs Q8 and Q9 are connected to the return line 3 of the motor and to the forward/reverse switch 312 at line 2'.

Consequently, when the output of NOR gate 350 in logic circuit 318 goes high, switching FET Q3 is turned on, thereby turning on FET Q6 and rendering conductive BRAKE FETs Q8 and Q9 to dynamically brake the motor. Conversely, when the output of NOR gate 350 is low, switching FET Q3 is turned off, switching FET Q6 is turned off, and BRAKE FETs Q8 and Q9 are disabled. In addition, to ensure that the BRAKE FETs Q8 and Q9 are never conducting when the RUN FET Q10 is on, the output from NOR gate 348 which controls the conductive state of the RUN FET Q10, is also supplied to the gate of another FET Q7. FET Q7 has its drain connected through resistor R33 to the gates of both BRAKE FETs Q8 and Q9 and its source connected to ground. Thus, when the output of NOR gate 348 goes high and renders RUN FET Q10 conductive, FET Q7 is also rendered conductive to thereby clamp both BRAKE FETs Q8 and Q9 in the off condition.

Lastly, with reference to the LED subcircuit 328 shown in FIG. 17A, the output from NOR gate 350 is supplied to the gate of FET Q2 which has its drain connected to the cathode of an LED DS1 and its source connected to ground. The anode of the LED DS1 is connected to the battery 22 through parallel resistors R17 and R23. Thus, whenever the output of NOR gate 350 goes high to dynamically brake the motor, which occurs when the clutch sensor switch 56 opens in response to disengagement of the clutch, FET Q2 is rendered conductive and LED DS1 is illuminated to provide a visual signal to the operator of the power tool.

Operation of the above-described control circuit 310 will now be described. Initially, to initiate the RUN mode, the power tool user actuates the trigger switch 31 to energize the motor and drive a fastener. The motor is energized due to the following circuit conditions which exist when the trigger switch 31 is initially actuated. Because there is no charge on capacitor C2, the signal level at the positive input of comparator 340 is less than the threshold signal at its negative input and the output of comparator 340 is low. The low signal from the output of comparator 340 is inverted by NOR gate 344, providing a high signal to pin 6 of NOR gate 346 and to pin 13 of NOR gate 350. Consequently, the outputs of both NOR gates 346 and 350, and hence both inputs of NOR gate 348, are low thus causing the output of NOR gate 348 to go high. As described above, when the output of NOR gate 348 is high, the RUN FET Q10 is rendered conductive and the motor is energized.

Assuming that the clutch is properly engaged, the clutch sensor switch 56 will be closed. Transistor Q1 is therefore rendered conductive, providing a high input to pin 5 of NOR gate 346, and initiating the charging of capacitor C2 through resistor R11. When the charge on capacitor C2 exceeds the threshold signal supplied to the negative input of comparator 340, the output of comparator 340 goes high. In the preferred embodiment, the time delay introduced by the changing of capacitor C2 is equal to approximately 8.5 milliseconds. The high signal from the output of comparator 340 is inverted by NOR gate 344, placing a low signal at the pin 6 input of NOR gate 346 and also at the pin 13 input of NOR gate 350. Because the pin 8 input of NOR gate 348 is still low, this does not cause an immediate change in the output states of the R-S flip-flop comprised of $NO_R$ gates 348 and 350. However, the logic circuit 318 is now "armed" to respond to the opening of the clutch sensor switch 56.

Importantly, it will be noted that if for some reason the clutch is stuck in the open position and hence the clutch sensor switch 56 is open, transistor Q1 will remain non-conductive when the motor is energized, preventing capacitor C2 from charging. Consequently, the logic circuit 318 will not become "armed" as just described and therefore will not erroneously respond to the open clutch sensor switch condition as indicative of having attained a desired torque threshold. Assuming that the clutch sensor switch 56 was properly closed as previously described, the RUN subcircuit 322 will remain enabled by logic circuit 318 until the preselected torque level for the fastener is attained.

When the power tool reaches the preset torque level, the power tool clutch disengages. Consequently, the clutch sensor switch 56 opens and turns off transistor Q1. This causes the input at pin 5 of NOR gate 346 to go low, in turn causing its output at pin 4 to go high. The resulting high input at pin 8 of NOR gate 348 causes the R-S flip-flop to change its output states. In other words, the output of NOR gate 348 switches from a high to a low state and the output of NOR gate 350 switches from a low to a high state. With the output at pin 10 of logic circuit 318 low, FET Q4 of the RUN subcircuit 322 is disabled, thereby turning on transistor Q5 and turning off the RUN FET Q10 to de-energize the motor. With FET Q4 turned off, capacitor C5 will discharge through resistor R27.

Simultaneously, with the output at pin 11 of logic circuit 318 high, the BRAKE circuit 324 is enabled. In particular, the high signal from NOR gate 350 is provided through an RC time delay circuit, comprised of capacitor C4 and resistor R21, to the gate of FET Q3 to turn it on. With FET Q3 on, FET Q6 is rendered conductive thereby turning on the BRAKE FETs Q8 and Q9. Importantly, the time delay circuit, which provides an approximately 84 millisecond delay, ensures that the RUN FET Q10 is completely turned off before the BRAKE FETs Q8 and Q9 are turned on. This prevents the power FETs from erroneously shorting out.

With the BRAKE FETs Q8 and Q9 turned on, the motor is shorted to thereby dynamically brake it. Capacitor C6, which is charged through resistor R30 while the RUN FET Q10 is turned on, loses charges during the BRAKE mode but it is chosen high enough to ensure that the BRAKE FETs Q8 and Q9 remain turned on for a sufficient period—at least 150 milliseconds—to properly brake the motor and also to ensure that the $Q_8$ and $Q_9$ have sufficient gate drive.

As previously noted, when the clutch of the power tool disengages and the control circuit switches from the RUN mode to the BRAKE mode, FET Q2 is rendered conductive and the LED DS1 is illuminated. Having completed the setting of the fastener, the operator will release the trigger switch 31. When the trigger switch 31 is released, the output of comparator 342 goes low causing the charge on capacitor C2 to discharge through resistor R9 and diode D11.

When capacitor C2 discharges below the threshold level of comparator 340, the output of comparator 340 goes low to disarm and thus reset the logic circuit 318. In particular, the low output signal from comparator 340 is inverted by NOR gate 344 placing a high signal at both input pin 6 of NOR gate 346 and input pin 13 of NOR gate 350. The output of NOR gate 346 then switches to a low state causing the outputs of the R-S flip-flop to again change states from the BRAKE mode to the RUN mode. However, despite the fact that the output of NOR gate 348 is now high and the output of NOR gate 350 low, the RUN FET Q10 is not re-enabled because the trigger switch 31 is disengaged.

During normal operation, clutch 50 re-engages and clutch sensor switch 56 returns to a closed position after motor 32 is braked and trigger switch 31 is released. Accordingly, when trigger switch 31 is subsequently actuated and power is again supplied to motor 32, transistor Q1 will turn on, capacitor C2 will charge, and the logic circuit 318 will return to the "armed" state as described above. However, if clutch sensor switch 56 remains open, such as can occur if clutch 50 becomes stuck in the open position, transistor Q1 will remain non-conductive and capacitor C2 will not charge to arm the logic circuit 318. Consequently, if clutch 50 suddenly re-engages, causing clutch sensor switch 56 to bounce as it closes, control circuit 44 will not falsely detect an open clutch switch condition and erroneously brake motor 32.

Therefore, it will be appreciated that control circuit 44 according to the present invention is able to react appropriately to temporary anomalies in the operation of the mechanical clutch mechanism of the tool which can be expected in the intended harsh working environment to which the tool will be subjected. In particular, the delay introduced by the charging of capacitor C2 prevents the control circuit from erroneously responding to clutch sensor switch bounce as described. In addition, if the clutch is temporarily stuck in the disengaged position following the setting of a fastener, the control circuit will permit the motor to be re-energized to enable the clutch to re-engage, but will not look for an open clutch sensor condition until a predetermined time period after the clutch has re-engaged. Accordingly, the control circuit is able to recognize the stuck clutch condition and ignore the corresponding open clutch sensor switch. The present control circuit accomplishes this function by effectively waiting for the clutch sensor switch to first close for a predetermined period (e.g., 8.5 milliseconds) before looking for the clutch sensor switch to open. In other words, the control circuit will only switch from the RUN mode to the BRAKE mode upon the transition of the clutch sensor switch from a stable closed position to an open position. Consequently, the duration of the time delay introduced by the capacitor C2 need only be long enough to filter out clutch switch bounce and thus identify a stable closed switch condition.

At this point, it should be noted that if the clutch is stuck in the open position following the setting of a fastener, the control circuit will not permit the operator to run the tool indefinitely in this condition as this may damage the tool. In other words, if the clutch has not re-engaged after an extended period (e.g., 5 seconds) the control circuit will interrupt power and brake the motor. This occurs because the bias current supplied to the comparator amplifiers 340 and 342 is sufficient, even with transistor Q1 turned off, to gradually charge capacitor C2 over an extended period, such as five seconds. Consequently, even if the clutch has not re-engaged within this period, the capacitor C2 will accumulate sufficient charge to exceed the threshold signal applied to the negative input of comparator 340 and terminate the RUN mode and initiate the BRAKE mode in the manner described above.

Additionally, it will be noted that the control circuit also disables the dynamic braking function when the power tool is operated in a reverse mode to remove a fastener from a workpiece. In the reverse mode, the return line 3 from the motor is high instead of low. Because line 3 is high, the BRAKE FETs Q8 and Q9 can not turn on. Thus, the BRAKE function of the control circuit is disabled.

The above-described forward/reverse switch connections also minimize the number of requisite wires and connectors needed to implement the control circuit of the present invention. As is known, system wiring and connectors are problematic in system assembly manufacturing, as they increase the number of assembly operations and therefore tend to reduce product reliability. In prior art motor control circuits having dynamic braking capability, it is conventional to connect the BRAKE FET between lines 1 and 2 of the forward/reverse switch. Therefore, it is typically necessary to include a current-carrying wire from the printed circuit board to an additional connector, such as a rivet or screw clamp, on the drain of the RUN FET. In the circuitry of the present invention, the need for this additional wire and connector is eliminated by connecting the sources of the BRAKE FETs to line 2' instead of line 2. In other words, the connection of the drain of the RUN FET to the switch line 2 and the connection of the sources of the BRAKE FETs Q8 and Q9 to the switch line 2' obviates the need for a separate wire from the RUN FET to the BRAKE FETS. Further, these connections also eliminate the need for a separate wire from the clutch sensor switch 56 to the forward/reverse switch 312, as this connection can now be implemented via a track on the printed circuit board, designated line 360 in the drawing.

Thus, the above connection system of the present invention increases system reliability by reducing the wires and connectors needed to implement the system. Also, because a shorter current-carrying wire is used to connect the motor negative side to the BRAKE FET sources, inductance and inductive spikes are reduced. Further, system assembly is simplified through elimination of the previously-required wire from the RUN FET to the BRAKE FETS. Additionally, manufacture of the system is simplified, as the need for the above-mentioned connector to the drain of the RUN FET is eliminated. It should also be appreciated that this system simplification could be implemented in any DC motor dynamic braking circuit.

Referring to FIG. 9, decoupling sensor 56 will now be described in detail. Decoupling sensor 56 includes a membrane switch 380 mounted below driven cam disk 142. Membrane switch 380 is operatively connected to housing 12. Decoupling sensor 56 further includes a plunger 382 slidably mounted on a sensor assembly block 384. Plunger 382 includes a smooth compliant tip 389 to reduce wear of membrane switch. Plunger 382 abuts a spring 386 which is compressibly mounted between plunger 382 and an inner switch wall 388.

Figure 18:
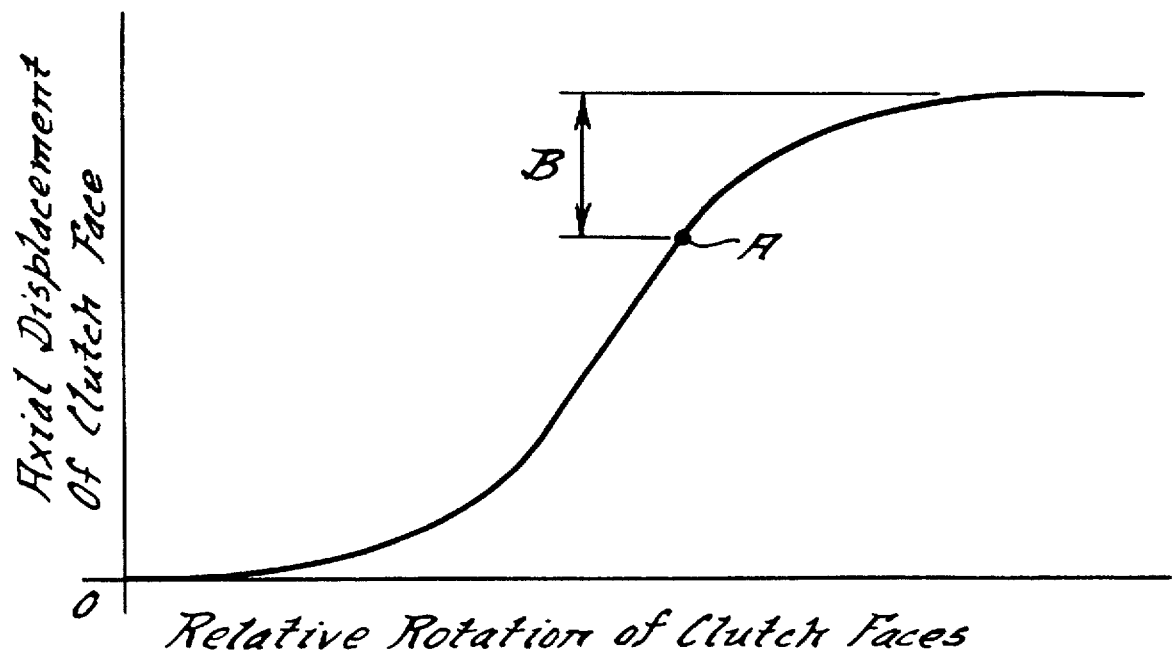
FIG. 18 is a graphical illustration of axial displacement of the clutch driven cam disk versus rotation of the clutch driving cam disk and the driven cam disk faces relative to each other.

Sensor assembly block 384 is axially slidable within housing 12. This movement allows plunger 382 to be placed a predefined distance from the axially moving driven cam disk 164. This predefined distance can be defined by plunger features or by a gage block (not shown) that is used during assembly of the tool. Because this adjustment is critical to the operation of the tool, spindle 58 is biased rearwardly in housing 12 by a pair of thrust washers 381 which sandwich a wavy spring washer 383. Washers 381 and spring washer 383 are disposed between a flange bearing 385 which is secured within housing 12 and a snap ring 387 which is located within a groove machined into spindle 58. Thus, any axial movement of spindle 58 and thus driving and driven disks 142 and 164 respectively is eliminated allowing a more accurate adjustment of sensor block 384 and plunger 382 relative to driven disk 164. The adjustment of the prespecified distance between plunger 382 and driven disk 164 should be accomplished while ensuring the proper location of plunger 382 and coil spring 386. The predefined distance is shown graphically shown in FIG. 18. The gaging block should position plunger 382 such that membrane switch 380 is opened upon achieving axial displacement at point "A." This axial displacement represents an ideal situation where the signal is set at the preset torque level. In practice, however, tool tolerances must be considered. For example, if the gaging block positions sensor block 384 and plunger 382 to open membrane switch 380 at position A, mechanical tolerances in the system may actually allow membrane switch 380 to open prior to reaching point A. This will result in an under-torqued fastener due to premature braking. Therefore, it is desirable for the gaging block to position the sensor block and plunger near the mid-point of zone B. This positioning ensures the membrane switch activation does not occur prior to displacement of point A and also ensures membrane switch activation occurs before maximum clutch travel. If activation does not occur before maximum clutch travel, continuous running and ratcheting of the tool will occur until trigger release. Correct calibration of the decoupling sensor activation point also leads to improved insensitivity to running fasteners of varying joint rates. For example, because the tool has a finite system response time which is more than the time it takes between the incorrectly calibrated decoupling sensor signal and the point in time that the clutch transmits peak torque, hard joint fasteners may not be affected by activation of the sensor prior to reaching point A. However, because a soft joint happens over a considerably longer period of time, it is possible for the sensor to activate prior to point A and have the motor dynamically brake before it has transmitted the target torque.

In operation, when clutch 50 disengages upon the tool preset level of torque being reached, driven cam disk 164 strikes plunger 382 and moves it axially forward out of contact with membrane switch 380, thereby creating an open switch condition. This open switch condition subsequently causes membrane switch 380 to send a signal to control circuitry 44. Electronic control circuitry then operates as described above. The movement of plunger 382 away from membrane switch 380 makes this system insensitive to over travel of plunger 382 as any over travel simply increases the clearance between switch 380 and plunger 382. This is opposite to the condition in which continued travel of a plunger continues to apply load to a switching member.

Clutch 50 reengages subsequent to braking of the motor. Return spring 386 biases plunger 382 back into contact with membrane switch 380, thereby creating a closed switch condition. Subsequently, no signal is sent to control circuitry 44 until switch 380 is opened again.

It should be appreciated that the above described decoupling sensor is advantageous over prior clutch sensor switches in that the membrane switch 380 implemented in the decoupling sensor of the present invention provides a very predictable tightly tolerated actuation point for the decoupling sensor. Further, the membrane switch has an associated multi-million cycle life thereby minimizing maintenance and repair of the decoupling sensor. In addition, recalibration of the decoupling sensor can be easily accomplished by a simple feeler gage, of the type well known to those skilled in the art.

Figure 19:
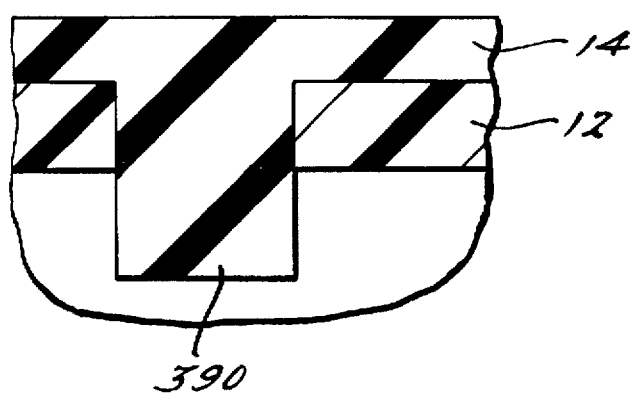
FIG. 19 is a cross-sectional view of the housing showing an integrally formed molded plug.

Referring to FIGS. 9 and 19-20, a rubber plug 390 helps secure the decoupling sensor switch within the housing as shown. The plug is integrally formed during the injection molding of the housing. The first shot material includes an aperture which is formed in the housing corresponding to the location of the decoupling sensor switch. Subsequently, the overmold layer is applied to the first shot material such that the overmold layer is extruded through the aperture and, upon cooling, forms the plug 390. The addition of the plug 390 therefore eliminates the need for an additional capturing device for the tool. Tool cost and complexity of assembly are thereby reduced.

Referring now to FIG. 1A, a tool lubrication access port is shown generally at 392. The lubrication access port 392 is formed in the first shot material forming the base of the housing 12 during the formation of the housing in the aforementioned molding process. The port is subsequently covered with the overmold exterior covering. The overmold exterior covering 14 creates a dimpled surface over the port 392 to create a visual depression in the tool housing. As previously mentioned, the overmold material is preferably a neoprene rubber capable of being self-sealing upon being punctured but any material exhibiting similar properties could be used.

In operation, a needle from a lubrication device (not shown) may be inserted through the overmold covering the access port so as to deposit lubrication on the desired components within the housing. Typically, the components to be lubricated consist of ball bearings, cam surfaces, splines, ball carriers, gear train components, sleeve bearings, detent features and others. When the lubrication needle is withdrawn, the overmold layer due to its characteristic properties self-seals. Thus, through use of overmolding technology well known in the art, a leak resistant lubrication port may be formed thus eliminating the need to completely open the tool housing to lubricate tool inner components.

While the above description constitutes the preferred embodiment of the present invention, it should be appreciated that the invention may be modified without departing from the proper scope and fair meaning of the accompanying claims. In particular, it should be appreciated that the above described control circuit may be used with any electric motor based application requiring both motor RUN and BRAKE modes in response to a set of predetermined conditions. Various other advantages of the present invention will become apparent to those skilled in the art after having the benefit of studying the foregoing text and drawings taken in conjunction with the following claims.

What is claimed is:

1. An electrically powered tool for driving a fastener to a predetermined torque level including a housing, a motor disposed within the housing for rotatably driving an output spindle journalled with respect to the housing and adapted for drivingly engaging the fastener, a clutch disposed between the motor and the output spindle and movable in response to the torque applied to the output spindle attaining said predetermined torque level from an engaged position wherein torque from the motor is applied to the output spindle to a disengaged position wherein torque from the motor is not substantially applied to the output spindle, and a clutch switch operatively associated with the clutch and responsive to movement of the clutch for switching from a first state when the clutch is in the engaged position to a second state when the clutch is in the disengaged position;

the improvement comprising a control circuit for controlling the energization and braking of the motor, the control circuit including a RUN circuit connected to the motor and adapted when enabled to energize the motor, a BRAKE circuit connected to the motor and adapted when enabled to dynamically brake the motor, a logic circuit connected to said RUN circuit and BRAKE circuit for controlling the enabling of said RUN circuit and BRAKE circuit, and a monitor circuit connected to said clutch switch for monitoring the position of said clutch switch, said monitor circuit providing a first signal to said logic circuit after the clutch switch has remained in said first state for a first predetermined period of time and a second signal when said clutch switch is in said second state;

said logic circuit being operative to disable said RUN circuit and enable said BRAKE circuit in response to the receipt from said monitor circuit of said second signal only when preceded by the receipt from said monitor circuit of said first signal.

2. The tool of claim 1 wherein the monitor circuit includes a time delay circuit that is responsive to the clutch switch switching to said first state and is adapted to produce said first signal after the clutch switch has remained in said first state for said first predetermined period of time.

3. The tool of claim 2 wherein said logic circuit has an armed state which it must be in before it can enable said BRAKE circuit and disable said RUN circuit and further wherein the receipt of said first signal from said monitor circuit is operative to put said logic circuit in said armed state.

4. The tool of claim 2 wherein said first predetermined period of time is of sufficient duration to filter out the effects of bouncing of said clutch switch.

5. The tool of claim 4 wherein said monitor circuit includes a second time delay circuit that is adapted to produce said first signal if said clutch switch remains in said second state for a second longer predetermined period of time while said RUN circuit is enabled.

6. The tool of claim 5 wherein said second predetermined period of time is of sufficient duration to determine that the clutch is stuck in said disengaged position.

7. The tool of claim 1 wherein said BRAKE circuit includes a time delay circuit for delaying the enabling of the BRAKE circuit to ensure that said RUN circuit is disabled before said BRAKE circuit is enabled.

8. The tool of claim 7 wherein said RUN circuit includes clamp circuit means connected to said BRAKE circuit for ensuring that said BRAKE circuit is disabled when said RUN circuit is enabled.

9. An electrically powered tool for driving a fastener to a predetermined torque level including a housing, a motor disposed within the housing for rotatably driving an output spindle journalled with respect to the housing and adapted for drivingly engaging the fastener, a clutch disposed between the motor and the output spindle and movable in response to the torque applied to the output spindle attaining said predetermined torque level from an engaged position wherein torque from the motor is applied to the output spindle to a disengaged position wherein torque from the motor is not substantially applied to the output spindle, and a clutch switch operatively associated with the clutch and responsive to movement of the clutch for switching from a first state when the clutch is in the engaged position to a second state when the clutch is in the disengaged position;

the improvement comprising control circuit means for controlling the energization of the motor in response to the position of said clutch switch, said control circuit means energizing said motor when said clutch switch is in said first state, detecting that said clutch switch has remained in said first state for a predetermined period of time, and de-energizing said motor when the clutch switch switches to said second state.

10. The tool of claim 9 wherein said predetermined period of time is of sufficient duration to filter out the effects of bouncing of said clutch switch.

11. The tool of claim 10 wherein said control circuit further includes brake circuit means for dynamically braking said motor when said motor is de-energized.

12. The tool of claim 11 wherein said control circuit further includes timing circuit means for ensuring that the motor is de-energized before it is dynamically braked.

13. A method of installing a threaded fastener to a predetermined torque level using an electrically powered tool having a housing, a motor disposed within the housing for rotatably driving an output spindle journalled with respect to the housing and adapted to drivingly engaging the fastener, a clutch disposed between the motor and the output spindle and movable in response to the torque applied to the output spindle attaining said predetermined torque level from an engaged position wherein torque from the motor is applied to the output spindle to a disengaged position wherein torque from the motor is not substantially applied to the output spindle, and a clutch switch operatively associated with the clutch and responsive to movement of the clutch for switching from a first state when the clutch is in said engaged position to a second state when the clutch is in said disengaged position; the method comprising the steps of:

(a) energizing the motor to drive the fastener;

(b) determining that the clutch is in the engaged position by detecting that the clutch switch is in said first state for a first predetermined period of time;

(c) determining that the clutch has moved to the disengaged position by detecting that the clutch switch has switched from said first state to said second state; and (d) de-energizing the motor.

14. The method of claim 13 further including the step following step (d) of dynamically braking the motor.

15. The method of claim 13 wherein said first predetermined period of time is of sufficient duration to filter out the effects of bouncing of said clutch switch.

16. The method of claim 15 further including the step of de-energizing the motor after a second longer predetermined period of time following the initial energization of the motor in step (a) if the clutch is not in the engaged position.

17. The method of claim 16 wherein said second predetermined period of time is of sufficient duration to determine that the clutch is stuck in the disengaged position.

* * * * *

UNITED STATES PATENT AND TRADEMARK OFFICE
CERTIFICATE OF CORRECTION

PATENT NO. : 5,738,177
DATED : April 14, 1998
INVENTOR(S) : Craig A. Schell et al.

It is certified that error appears in the above-identified patent and that said Letters Patent is hereby corrected as shown below:

On the Title Page, before "References Cited", item [60],
    add heading entitled --Related U.S. Application Data-- and
    --Provisional application No. 60/001,727, July 28, 1995--.

On the Title Page, under "Foreign Patent Documents",
    "465521 3/1994 European Pat. Off." should be
    --463521 3/1994 European Pat. Off.--.

Column 1, line 2, --Cross Referance To Related Application Reference is made to and priority claimed from U.S. provisional application Ser. No.: 60/001,727 filed July 28, 1995, entitled Production Assembly Tool.--

Signed and Sealed this

Twenty-fourth Day of November, 1998

Attest:

BRUCE LEHMAN

Attesting Officer      Commissioner of Patents and Trademarks